(12) United States Patent
Chew

(10) Patent No.: US 11,233,028 B2
(45) Date of Patent: Jan. 25, 2022

(54) CHIP PACKAGING METHOD AND CHIP STRUCTURE

(71) Applicant: PEP INNOVATION PTE. LTD., Singapore (SG)

(72) Inventor: Jimmy Chew, Singapore (SG)

(73) Assignee: PEP INOVATION PTE. LTD., Singapore (SG)

( * ) Notice: Subject to any disclaimer, the term of this patent is extended or adjusted under 35 U.S.C. 154(b) by 0 days.

(21) Appl. No.: 16/805,853

(22) Filed: Mar. 2, 2020

(65) Prior Publication Data

US 2020/0203302 A1 Jun. 25, 2020

Related U.S. Application Data

(63) Continuation-in-part of application No. 15/826,268, filed on Nov. 29, 2017.

(30) Foreign Application Priority Data

Mar. 11, 2019 (SG) ............................ 10201902149Q
Mar. 19, 2019 (SG) ............................ 10201902426V (Continued)

(51) Int. Cl.
*H01L 23/00* (2006.01)
*H01L 23/29* (2006.01)
(Continued)

(52) U.S. Cl.
CPC ............ *H01L 24/24* (2013.01); *H01L 21/568* (2013.01); *H01L 21/78* (2013.01); *H01L 23/295* (2013.01);
(Continued)

(58) Field of Classification Search
CPC ......... H01L 24/24; H01L 24/19; H01L 24/20; H01L 24/32; H01L 24/73; H01L 24/82;
(Continued)

(56) References Cited

U.S. PATENT DOCUMENTS 6,396,159 B1  5/2002 Shoji
8,293,576 B2  10/2012 Chino
(Continued)

FOREIGN PATENT DOCUMENTS

CN  103383927  11/2013
CN  103515252  1/2014
(Continued)

*Primary Examiner* — Thanhha S Pham
(74) *Attorney, Agent, or Firm* — Javalon Law, PC

(57) ABSTRACT

The present disclosure provides a chip packaging method and a chip structure. The chip packaging method comprises: providing a wafer, and forming a protective layer on a wafer active surface of the wafer; cutting and separating the wafer to form a die; providing a metal structure, the metal structure including at least one metal unit; adhering the die and the metal structure onto a carrier; and forming a molding layer. The chip structure comprises: at least one die; a protective layer; a metal unit, the metal unit including at least one metal feature; and a molding layer, encapsulating the at least one die and the metal unit, and the chip structure is connected with an external circuit through the at least one metal feature. By adopting a plurality of metal features of the metal unit, the present disclosure achieves improved packaging performance brought by different metal features; and the wafer active surface is provided with the protective layer in the present disclosure, so that a step of applying an insulating layer after the formation of the molding layer is omitted.

17 Claims, 16 Drawing Sheets

(30) Foreign Application Priority Data

Jun. 14, 2019 (SG) .......................... 10201905499U
Aug. 12, 2019 (CN) .......................... 201910741612.9

(51) Int. Cl.
- H01L 23/31 (2006.01)
- H01L 21/56 (2006.01)
- H01L 21/78 (2006.01)

(52) U.S. Cl.
CPC ...... *H01L 23/3171* (2013.01); *H01L 23/3185* (2013.01); *H01L 24/32* (2013.01); *H01L 24/73* (2013.01); *H01L 24/82* (2013.01); *H01L 2224/24011* (2013.01); *H01L 2224/24137* (2013.01); *H01L 2224/24175* (2013.01); *H01L 2224/32245* (2013.01); *H01L 2224/73267* (2013.01); *H01L 2224/82101* (2013.01)

(58) Field of Classification Search
CPC ... H01L 24/96; H01L 23/295; H01L 23/3107; H01L 23/3114; H01L 23/3121; H01L 23/3135; H01L 23/3171; H01L 23/3185; H01L 23/49568; H01L 2023/4037; H01L 2023/40

See application file for complete search history.

(56) References Cited

U.S. PATENT DOCUMENTS

| | | | |
|---|---|---|---|
| 8,848,380 B2 | 9/2014 | Malatkar et al. | |
| 9,793,230 B1* | 10/2017 | Yu | H01L 23/3185 |
| 10,431,477 B2 | 10/2019 | Chew | |
| 2009/0152715 A1* | 6/2009 | Shim | H01L 21/568 |
| | | | 257/737 |
| 2009/0261466 A1 | 10/2009 | Pagaila et al. | |
| 2010/0140779 A1 | 6/2010 | Lin et al. | |
| 2011/0026232 A1 | 2/2011 | Lin et al. | |
| 2011/0241222 A1 | 10/2011 | Sezi et al. | |
| 2011/0278741 A1 | 11/2011 | Chua et al. | |
| 2012/0119373 A1 | 5/2012 | Hunt | |
| 2012/0313238 A1 | 12/2012 | Sato et al. | |
| 2013/0241048 A1 | 9/2013 | Lin et al. | |
| 2013/0295725 A1 | 11/2013 | Park et al. | |
| 2013/0341784 A1 | 12/2013 | Lin et al. | |
| 2014/0023885 A1 | 1/2014 | Choi et al. | |
| 2014/0027885 A1 | 1/2014 | Kawase et al. | |
| 2014/0027929 A1 | 1/2014 | Lin et al. | |
| 2014/0042638 A1 | 2/2014 | Liu et al. | |
| 2015/0137162 A1 | 5/2015 | Sabathil et al. | |
| 2015/0145142 A1 | 5/2015 | Lin et al. | |
| 2015/0162289 A1 | 6/2015 | Chang et al. | |
| 2015/0179616 A1 | 6/2015 | Lin et al. | |
| 2015/0206855 A1 | 7/2015 | Lin | |
| 2015/0243607 A1 | 8/2015 | Jang et al. | |
| 2015/0314941 A1 | 11/2015 | Ramadas et al. | |
| 2016/0155713 A1 | 6/2016 | Kim et al. | |
| 2016/0276307 A1 | 9/2016 | Lin | |
| 2016/0338202 A1 | 11/2016 | Park et al. | |
| 2016/0343697 A1 | 11/2016 | Lee et al. | |
| 2017/0133334 A1 | 5/2017 | Kim et al. | |
| 2017/0250171 A1 | 8/2017 | Yu et al. | |
| 2017/0309571 A1 | 10/2017 | Yi et al. | |
| 2017/0365566 A1* | 12/2017 | Lee | H01L 24/19 |
| 2018/0082917 A1 | 3/2018 | Cheng et al. | |
| 2018/0166396 A1 | 6/2018 | Lee et al. | |
| 2018/0190513 A1 | 7/2018 | Chew | |
| 2018/0204741 A1 | 7/2018 | Chew | |
| 2018/0268188 A1 | 9/2018 | Zhang et al. | |
| 2018/0269188 A1* | 9/2018 | Yu | H01L 23/5384 |

FOREIGN PATENT DOCUMENTS

| | | |
|---|---|---|
| CN | 105304586 | 2/2016 |
| TW | 201327744 | 7/2013 |
| TW | 201830621 | 8/2018 |
| TW | 201834086 | 8/2018 |
| TW | 201832297 | 9/2018 |
| TW | 201834085 | 9/2018 |
| TW | 201834088 | 9/2018 |
| TW | 201900761 | 1/2019 |
| TW | M589895 | 1/2020 |
| TW | M589897 | 1/2020 |

* cited by examiner

CHIP PACKAGING METHOD AND CHIP STRUCTURE

CROSS-REFERENCE TO RELATED APPLICATIONS

This application is a continuation-in-part application of co-pending U.S. patent application Ser. No. 15/826,268 entitled "Method of Packaging Chip and Chip Package Structure", filed on Nov. 29, 2017, and cross-references to co-pending U.S. patent application Ser. No. 16/805,846 entitled "Chip Packaging Method and Package Structure", filed on Mar. 2, 2020, co-pending U.S. patent application Ser. No. 16/805,850 entitled "Chip Packaging Method and Package Structure", filed on Mar. 2, 2020, and co-pending U.S. patent application Ser. No. 16/805,851 entitled "Chip Packaging Method and Package Structure", filed on Mar. 2, 2020. All disclosures are herein incorporated by reference in their entireties for all purposes.

TECHNICAL FIELD

The present disclosure relates to a field of semiconductor technologies, and more particularly, to a chip packaging method and a chip structure.

BACKGROUND

Panel-level package is a process of cutting a wafer to separate out a plurality of dies, arranging and adhering the dies onto a carrier, and simultaneously packaging the plurality of dies in a same process. The panel-level package has received wide attention as a technique emerging in recent years; and as compared with traditional wafer-level package, the panel-level package has advantages of high production efficiency, low production costs, and better applicability to mass production.

SUMMARY

According to various embodiments, the present disclosure is intended to provide a chip packaging method, the chip packaging method comprises: providing a wafer, and forming a protective layer on a wafer active surface of the wafer; cutting and separating the wafer to form a die; providing a metal structure, the metal structure including at least one metal unit; adhering the die and the metal structure onto a carrier; and forming a molding layer.

According to various embodiments, the present disclosure further provides a chip structure, the chip structure comprises: at least one die; a protective layer; a metal unit, the metal unit including at least one metal feature; and a molding layer, encapsulating the at least one die and the metal unit, and the chip structure is connected with an external circuit through the at least one metal feature.

According to various embodiments, by adopting a plurality of metal features of the metal unit, the present disclosure achieves improved packaging performance brought by different metal features.

The metal feature for example includes a connection structure and a heat dissipation structure, the connection structure is connected with an electrical connection pad provided on a die active surface of the die in the chip through a conductive structure, and the packaged chip structure is connected with the external circuit such as a PCB board through the connection structure, so that a wire bonding structure is replaced. As compared with the wire bonding package structure, the present disclosure has a simpler packaging process, avoids mutual interference of signals between wires in the wire bonding structure, and avoids noises generated by vibration of the wires in the case that the chip is in operation. In addition, the connection structure is employed to replace the wire structure, so that the present disclosure is more applicable to the package of the chip with a large electric flux.

Further, the die arranged on the carrier together with the metal structure is the die having the protective layer; because the die arranged on the carrier already has the protective layer in the present disclosure, a step of forming a panel-level conductive layer is directly performed without firstly performing a step of applying an insulating layer after the formation of the molding layer. Especially in a large-size panel, if the insulating layer is formed on an entirety of the panel, a process difficulty is much greater than that of forming the small-area protective layer, and an application amount of an insulating layer material is increased for purpose of forming the insulating layer on the entirety of the panel.

Further, the protective layer and the molding layer employed in the present disclosure have certain material properties, and the material properties are helpful to reduce warpage of the panel in the packaging process and make the packaged chip structure more durable, so that the present disclosure is especially suitable for large panel-level package and package of a thin chip with a large electric flux.

DETAILED DESCRIPTION

In order to make the technical solution of the present disclosure clearer and the technical effect more apparent, preferred embodiments of the present disclosure will be described and explained in detail below in conjunction with the accompanying drawings; it cannot be understood that the description below is the only implementation form of the present disclosure or a limitation to the present disclosure.

Figure 1:
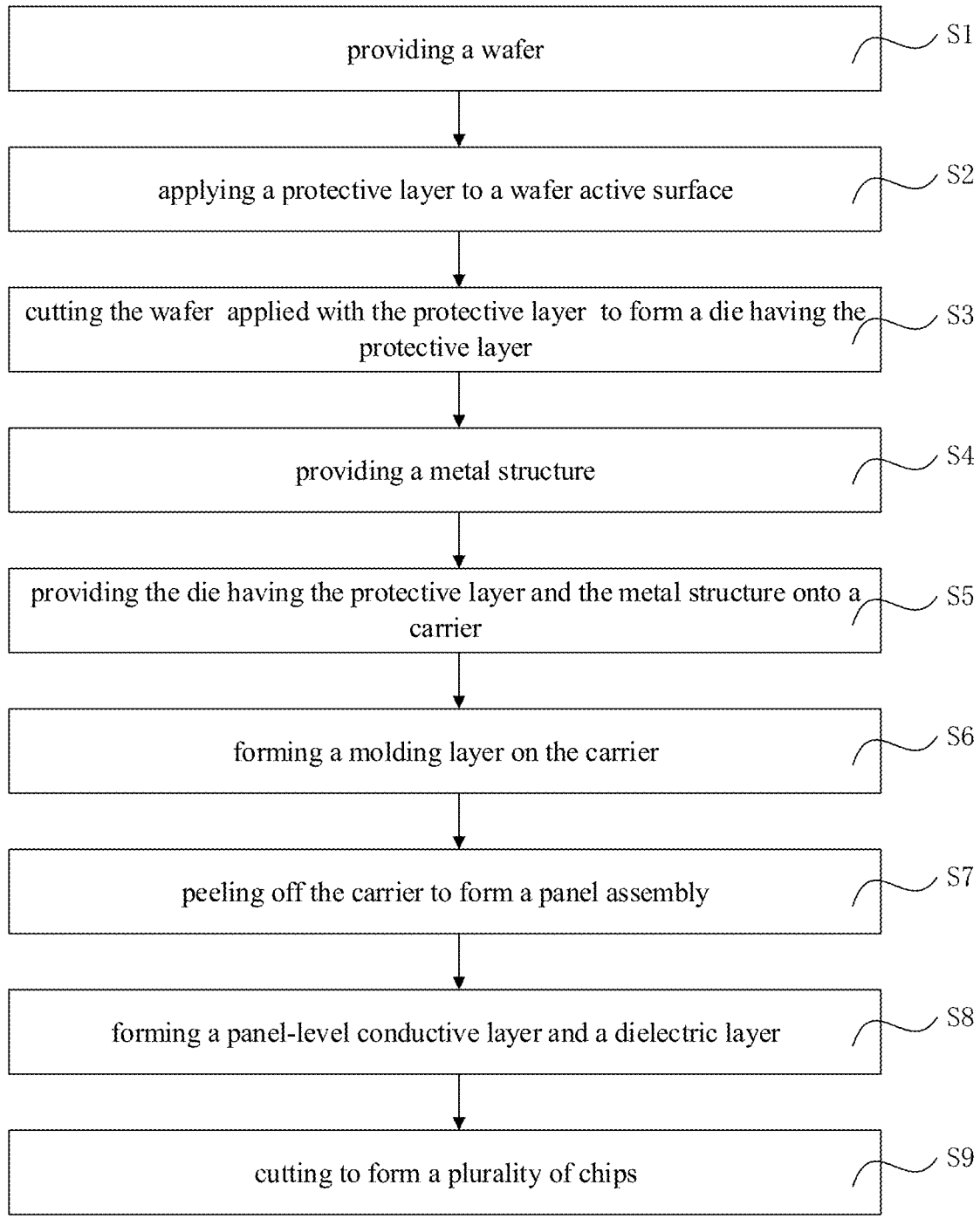
FIG. 1 is a flow chart of a chip packaging method according to an exemplary embodiment of the present disclosure.

FIG. 1 is a flow chart of a chip packaging method according to Embodiment 1 of the present disclosure. Referring to FIG. 1, the method according to the present disclosure comprises the following steps:

Step S1: providing a wafer 100.

Figure 2:
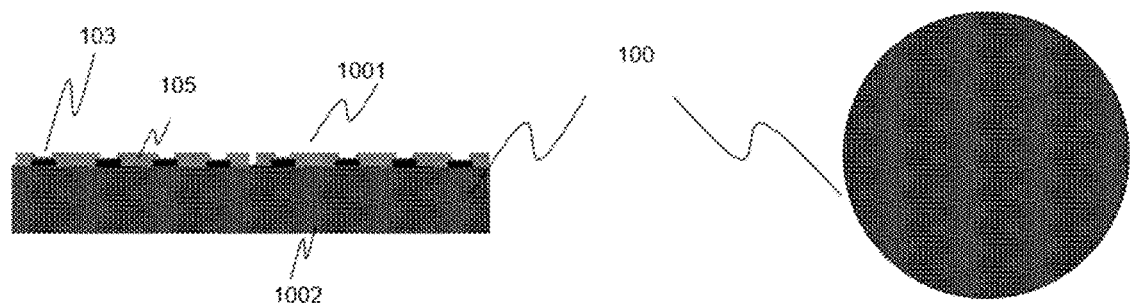
FIG. 2 to FIG. 15 are schematic diagrams of the chip packaging method according to an exemplary embodiment of the present disclosure.

As shown in FIG. 2, at least one wafer 100 is provided; the wafer 100 has a wafer active surface 1001 and a wafer back surface 1002; the wafer 100 includes a plurality of dies 113, and active surfaces of the dies constitutes the wafer active surface 1001; the active surface of each die in the wafer 100 forms active components and passive components by using a series of processes such as doping, deposition and etching, etc.; the active components include diodes and triodes, etc.; the passive components include voltage elements, capacitors, resistors and inductors, etc.; and these active components and passive components are connected by connection wires to form a functional circuit, so as to implement various functions. The wafer active surface 1001 further includes an electrical connection pad 103 for leading out the functional circuit and an insulating layer 105 for protecting the electrical connection pad 103.

Step S2: applying a protective layer 107 to the wafer active surface 1001.

Figure 3A:
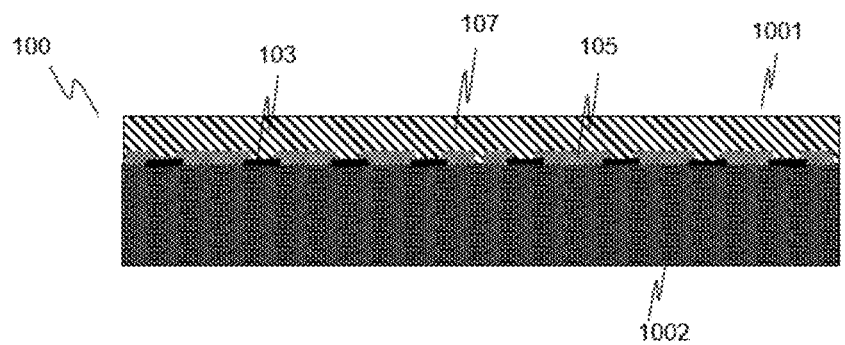
Figure 3B:
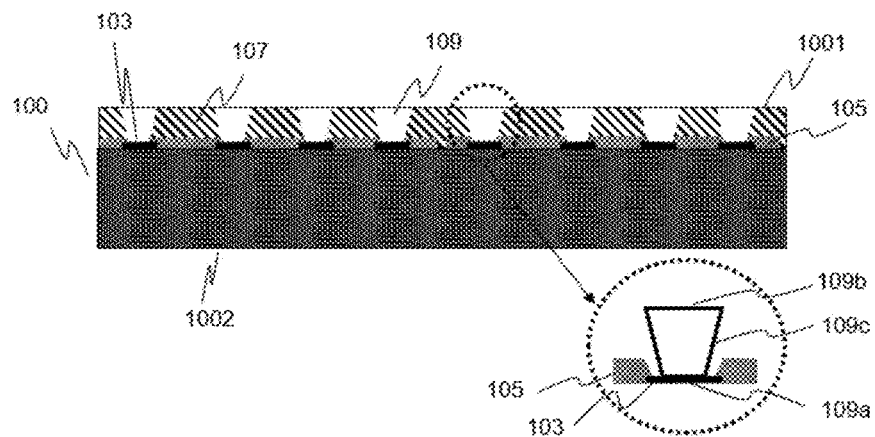

FIG. 3a to FIG. 3b show an optional process of applying the protective layer 107 to the wafer active surface 1001.

As shown in FIG. 3a, the protective layer 107 is applied to the wafer active surface 1001.

Preferably, the protective layer 107 is applied to the wafer active surface 1001 by lamination.

Optionally, before the step of applying the protective layer 107 to the wafer active surface 1001, the wafer active surface 1001 and/or a surface, which is to be applied to the wafer 100, of the protective layer 107 are physically and/or chemically treated, so that the protective layer 107 and the wafer 100 are bonded together more closely. The treatment optionally is plasma surface treatment to roughen the surface so as to increase a bonding area and/or chemically-promoting modifier treatment of introducing a chemically-promoting modifier group (for example, a surface modifier comprising both a group having affinity with an organic substance and a group having affinity with an inorganic substance) between the wafer 100 and the protective layer 107 so as to increase a bonding force at an interface between the organic layer and the inorganic layer.

As shown in FIG. 3b, a protective layer opening 109 is formed on a surface of the protective layer 107.

The protective layer opening 109 is formed in the protective layer 107 at a position corresponding to the electrical connection pad 103 provided on the wafer active surface 1001, to expose the electrical connection pad 103 provided on the wafer active surface 1001.

Preferably, the protective layer openings 109 correspond to the electrical connection pads 103 provided on the wafer active surface 1001 in a one-to-one manner.

Optionally, each protective layer opening 109 of at least a part of the protective layer openings 109 corresponds to a plurality of electrical connection pads 103.

Optionally, at least a part of the electrical connection pads 103 correspond to a plurality of protective layer openings 109.

Optionally, at least a part of the protective layer openings 109 have no corresponding electrical connection pads 103, or at least a part of the electrical connection pads 103 have no corresponding protective layer openings 109.

The protective layer opening is formed by a laser patterning process or a photolithography patterning process.

If the protective layer opening is formed by the laser patterning process, preferably, before the protective layer 107 is applied to the wafer active surface 1001, a chemical plating process is performed on the wafer active surface 1001 to form a conductive cover layer on the electrical connection pad 103. Optionally, the conductive cover layer comprises one or more layers of Cu, Ni, Pd, Au, Cr; preferably, the conductive protective layer is a Cu layer; and the conductive cover layer preferably has a thickness of 2 μm to 3 μm. The conductive cover layer is not shown in the drawings. The conductive cover layer protects the electrical connection pad 103 provided on the wafer active surface 1001 from being damaged by laser in a subsequent step of forming the protective layer opening.

Preferably, as shown by a partially enlarged view in FIG. 3b, a gap is between a lower surface 109a of the protective layer opening and the insulating layer 105; preferably, the lower surface 109a of the protective layer opening is located at a position close to a central portion of the electrical connection pad 103.

In a preferred embodiment, the protective layer opening 109 has a shape such that an area of an upper surface 109b of the protective layer opening is larger than an area of the lower surface 109a of the protective layer opening, and an area ratio of the lower surface 109a to the upper surface 109b is 60% to 90%.

In this case, a side wall 109c of the protective layer opening has a slope which facilitates filling of a conductive material, so that the conductive material is uniformly and continuously formed on the side wall during a filling process.

Optionally, the protective layer opening 109 is not formed in this step, and the protective layer opening 109 is formed in the protective layer for example after a process of peeling off a carrier.

Optionally, a conductive medium is filled in the protective layer opening 109 such that the protective layer opening 109 becomes a conductive filled via 124. At least one of the conductive filled vias 124 are connected with the electrical connection pads 103 provided on the wafer active surface 1001. In this way, the conductive filled via 124 leads out the electrical connection pad 103 provided on the wafer active surface 1001 unilaterally to the surface of the protective layer, and the protective layer is formed around the conductive filled via 124. The conductive medium for example is made of a material such as gold, silver, copper, tin, aluminum and the like, or a combination thereof, or other suitable conductive materials; the conductive medium is filled in the protective layer opening 109 to form the conductive filled via 124 by physical vapor deposition (PVD), chemical vapor deposition (CVD), sputtering, electrolytic electroplating, electrodeless electroplating, or other suitable metal deposition processes.

Figure 4A:
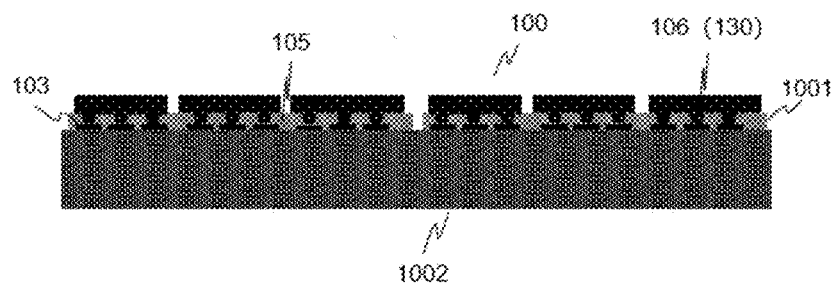
Figure 4B:
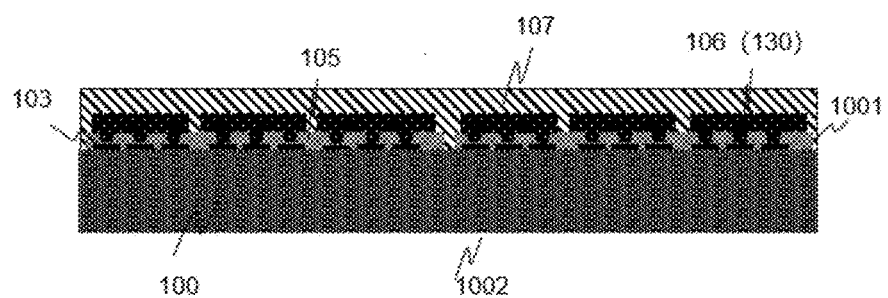
Figure 4C:
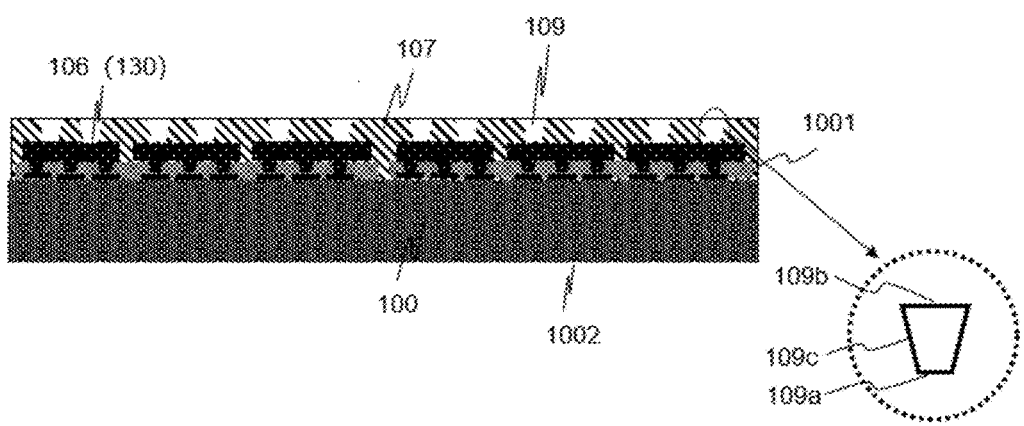

FIG. 4a to FIG. 4c show another optional process of applying the protective layer 107 to the wafer active surface 1001.

As shown in FIG. 4a, a wafer conductive layer 130 is formed on the wafer active surface 1001.

The wafer conductive layer 130 is a wafer conductive trace 106. The wafer conductive trace 106 for example is made of a material such as copper, gold, silver, tin, aluminum and the like, or a combination thereof, or other suitable conductive materials by PVD, CVD, sputtering, electrolytic electroplating, electrodeless electroplating, or other suitable metal deposition processes.

At least a part of the wafer conductive traces 106 are connected with at least a part of the electrical connection pads 103 provided on the wafer active surface 1001.

Figure 6A:
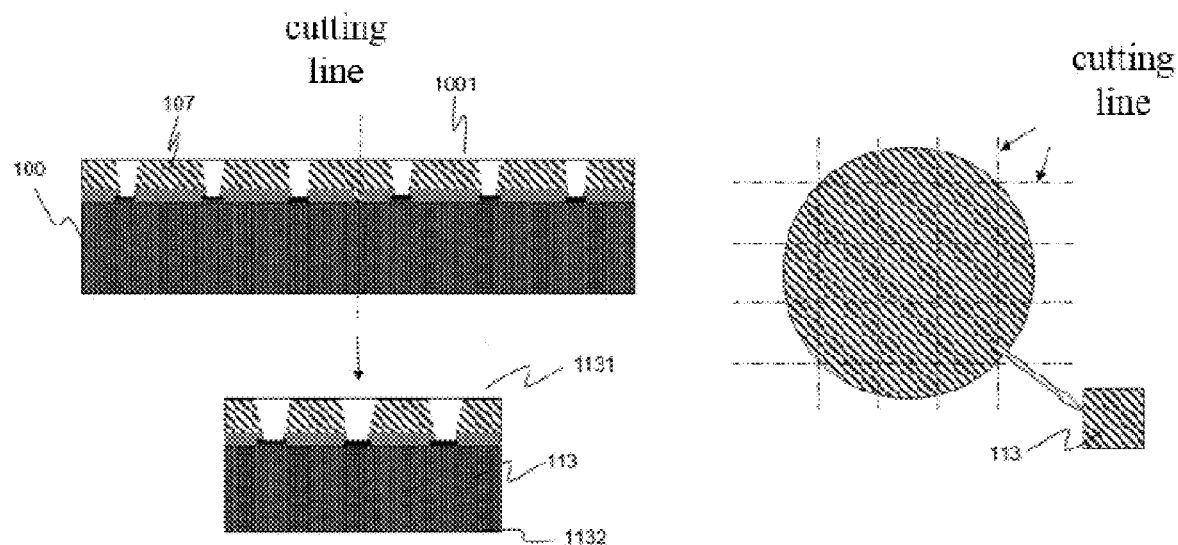
Figure 6B:
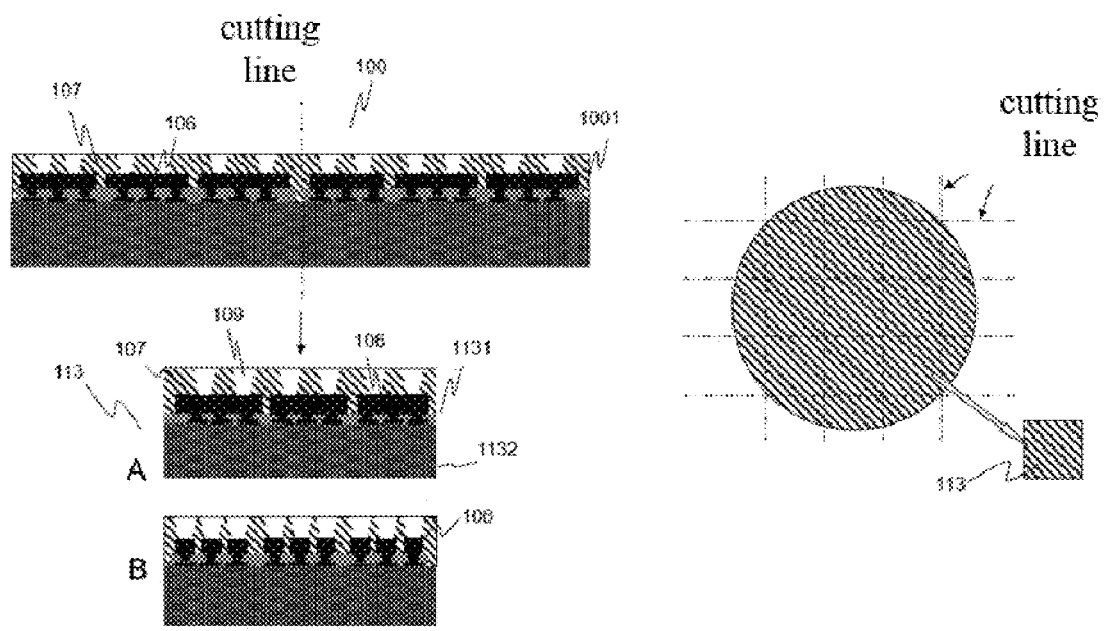

Optionally, the wafer conductive trace 106 interconnects and leads out a plurality of electrical connection pads 103 of at least a part of the electrical connection pads 103 provided on the wafer active surfaces 1001, to obtain the die shown in a die schematic diagram A in FIG. 6b.

Formation of the wafer conductive trace 106 reduces the amount of protective layer openings 109 formed in a subsequent process; and the wafer conductive trace 106 is employed to firstly interconnect the plurality of electrical connection pads 103 according to the circuit design, so that it is not necessary to form the protective layer opening 109 on each electrical connection pad 103.

Optionally, the wafer conductive traces 106 respectively lead out at least a part of the electrical connection pads 103 provided on the wafer active surface 1001, to obtain the die shown in a die schematic diagram B in FIG. 6b.

Formation of the wafer conductive trace 106 reduces a difficulty of forming the protective layer opening 109 in a subsequent process; due to the presence of the wafer conductive trace 106, the lower surface 109a of the protective layer opening has a larger area, and accordingly the protective layer opening 109 has a larger area, so that it is possible to form the protective layer opening especially on the wafer 100 having a smaller exposed electrical connection pad 103.

Although not shown in the drawings, it should be understood that, a part of the wafer conductive traces 106 respectively lead out a part of the electrical connection pads 103 provided on the wafer active surface 1001, and each of a part of the wafer conductive traces 106 interconnects and leads out a part of the electrical connection pads 103 provided on the wafer active surface 1001.

As shown in FIG. 4b, the protective layer 107 is applied to the wafer active surface 1001 and the wafer conductive layer 130.

In one embodiment, the protective layer 107 is applied by lamination.

Optionally, before the step of applying the protective layer 107, the wafer active surface 1001 and/or the surface, which is to be applied to the wafer 100, of the protective layer 107 are physically and/or chemically treated, so that the protective layer 107 and the wafer 100 are bonded together more closely. The treatment optionally is plasma surface treatment to roughen the surface so as to increase the bonding area and/or chemically-promoting modifier treatment of introducing the chemically-promoting modifier group (for example, the surface modifier comprising both the group having affinity with the organic substance and the group having affinity with the inorganic substance) between the wafer 100 and the protective layer 107 so as to increase the bonding force at the interface between the organic layer and the inorganic layer.

As shown in FIG. 4c, the protective layer opening 109 is formed on the surface of the protective layer 107.

Positions of at least a part of the protective layer openings 109 correspond to the wafer conductive layer 130, and the wafer conductive layer 130 is exposed through the protective layer opening 109; and the protective layer opening 109 has the lower surface 109a and the upper surface 109b.

In a preferred embodiment, the protective layer opening 109 has the shape such that the area of the upper surface 109b of the protective layer opening is larger than the area of the lower surface 109a of the protective layer opening; in this case, the side wall 109c of the protective layer opening has the slope which facilitates the filling of the conductive material, so that the conductive material is uniformly and continuously formed on the side wall during the filling process.

Preferably, a contact area of a single contact region between the wafer conductive layer 130 and the electrical connection pads 103 is smaller than a contact area of a single contact region between the wafer conductive layer 130 and the protective layer openings 109.

In a case that the wafer 100 is designed such that the exposed electrical connection pad 103 has a small area, by forming the conductive layer on the wafer active surface 1001 and then forming the protective layer opening, a difficulty in forming the protective layer opening is effectively reduced and a case that the protective layer opening 109 is difficult to form because the lower surface 109a of the protective layer opening is too small is avoided.

The protective layer opening is formed by the laser patterning process or the photolithography patterning.

Optionally, the protective layer opening 109 is not formed in this step, and the protective layer opening 109 is formed in the protective layer for example after the process of peeling off the carrier.

Optionally, the conductive medium is filled in the protective layer opening 109 such that the protective layer opening 109 becomes the conductive filled via 124; at least one of the conductive filled vias 124 are connected with the wafer conductive layer 130; and the protective layer surrounds the conductive filled via 124.

Figure 5A:
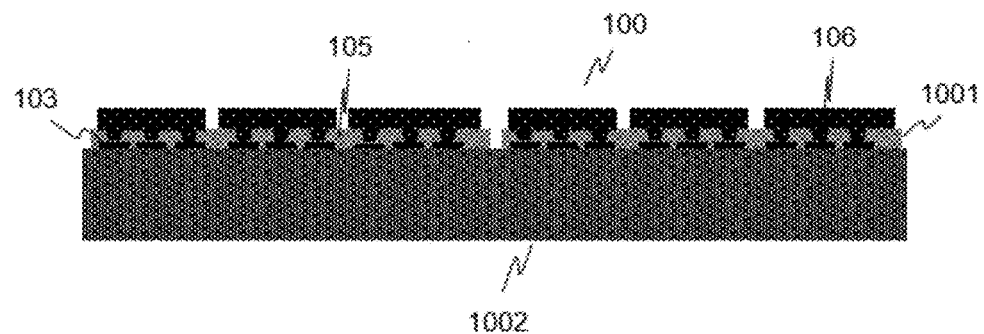
Figure 5B:
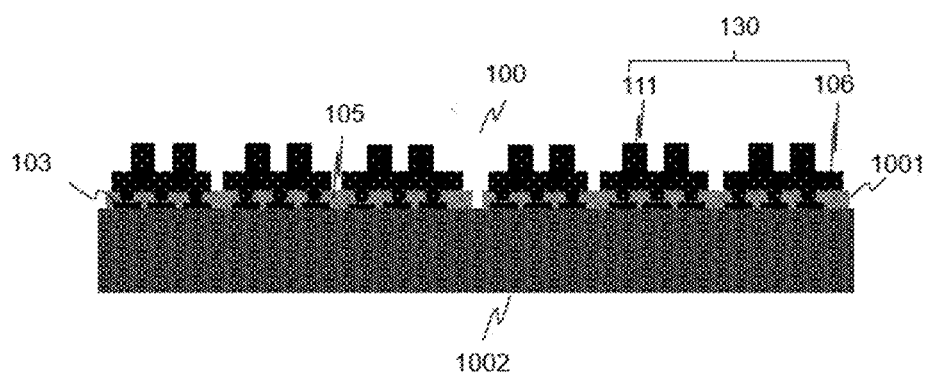
Figure 5C:
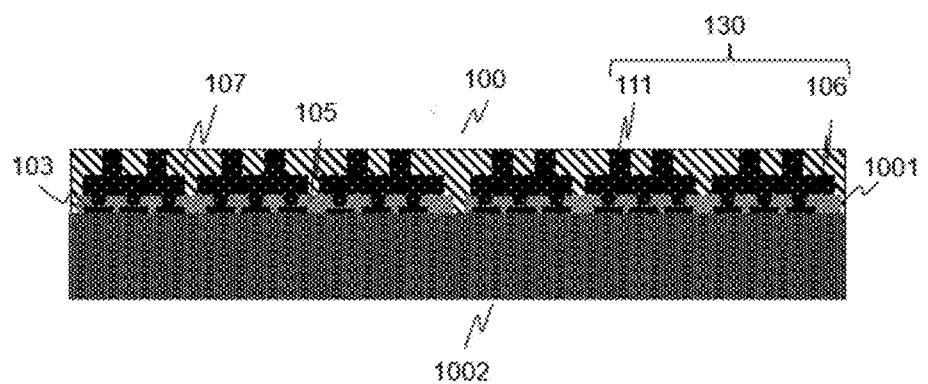

FIG. 5a to FIG. 5c show still another optional process of applying the protective layer 107 to the wafer active surface 1001.

As shown in FIG. 5a, the wafer conductive trace 106 is formed on the wafer active surface 1001.

The wafer conductive trace 106 for example is made of the material such as copper, gold, silver, tin, aluminum and the like, or a combination thereof, or other suitable conductive materials by PVD, CVD, sputtering, electrolytic electroplating, electrodeless electroplating, or other suitable metal deposition processes.

Each of at least a part of the wafer conductive traces 106 interconnects and leads out a plurality of electrical connection pads 103 of at least a part of the electrical connection pads 103.

Figure 6C:
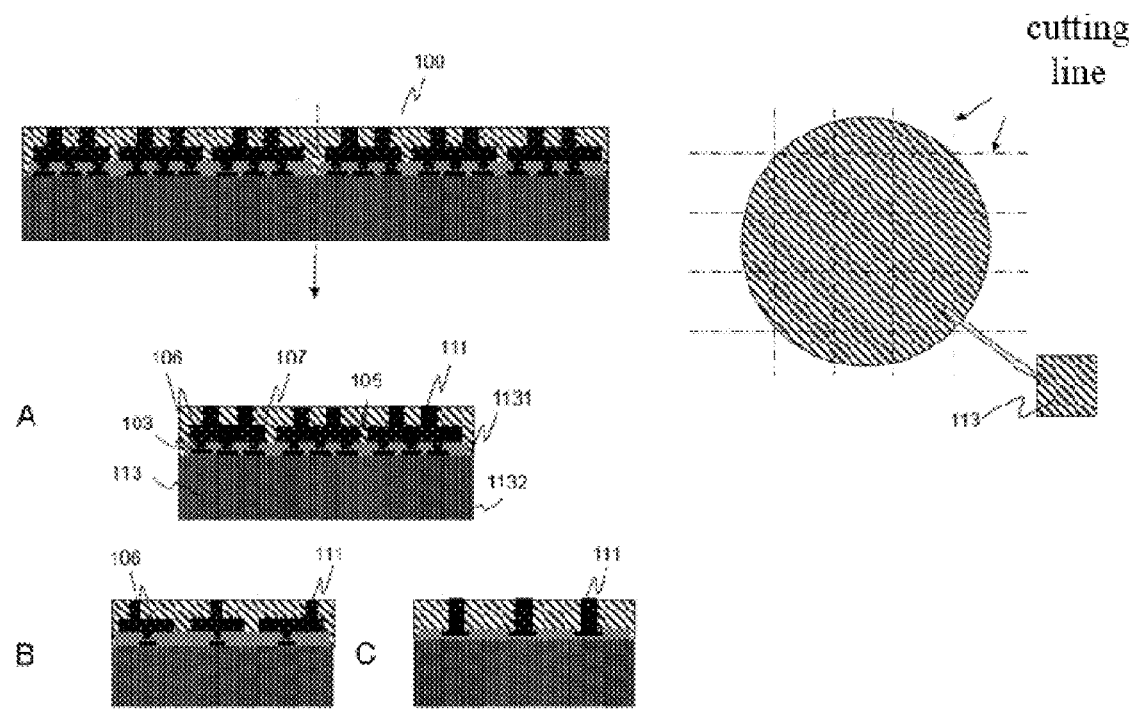

At least a part of the wafer conductive traces 106 respectively lead out at least a part of the electrical connection pads 103, to obtain the die shown in a die schematic diagram B in FIG. 6c.

As shown in FIG. 5b, a wafer conductive stud 111 is formed on a pad or a connection point of the wafer conductive trace 106.

The wafer conductive stud 111 for example has a shape of a circle, or may have other shape such as an ellipse, a square, a line and the like. The wafer conductive stud 111 for example is formed of one or more layers of a material such as copper, gold, silver, tin, aluminum and the like, or a combination thereof, or other suitable conductive material by PVD, CVD, sputtering, electrolytic electroplating, electrodeless electroplating, or other suitable metal deposition process.

Optionally, the wafer conductive stud 111 is directly formed on the electrical connection pad 103 provided on the wafer active surface 1001 and leads out the electrical connection pad 103, to obtain the die shown in a die schematic diagram C in FIG. 6c.

The wafer conductive trace 106 and/or the wafer conductive stud 111 are referred to as the wafer conductive layer 130.

As shown in FIG. 5c, the protective layer 107 is applied to the wafer conductive layer 130.

The protective layer 107 is applied onto the wafer conductive layer 130 to cover the wafer conductive layer 130.

In one embodiment, the protective layer is applied by lamination.

In one embodiment, the protective layer 107 is applied so that the protective layer 107 completely covers the wafer conductive layer 130, in this case, the protective layer 107 is thinned to expose a surface of the wafer conductive layer after the application process of the protective layer 107.

In another embodiment, the protective layer 107 is applied to have a thickness such that a surface of the wafer conductive layer 130 is just exposed.

Optionally, before the step of applying the protective layer 107, the wafer active surface 1001 formed with the wafer conductive layer 130 and/or the surface, which is to be applied to the wafer 100, of the protective layer 107 are physically and/or chemically treated, so that the protective layer 107 and the wafer 100 are bonded together more closely. The treatment optionally is plasma surface treatment to roughen the surface so as to increase the bonding area and/or chemically-promoting modifier treatment of introducing the chemically-promoting modifier group (for example, the surface modifier comprising both the group having affinity with the organic substance and the group having affinity with the inorganic substance) between the wafer 100 and the protective layer 107 so as to increase the bonding force at the interface between the organic layer and the inorganic layer.

The protective layer 107 is applied to the wafer active surface 1001 in step S2, the protective layer 107 prevents a permeation of a molding material so as to protect the active surface 1131 of the die from being damaged during a molding process; meanwhile, during the molding process, a molding pressure is not easy to cause a position shift of the die 113 on the carrier 117; in addition, an alignment accuracy requirement of a subsequent process of forming a panel-level conductive layer is lowered.

The protective layer 107 is made of an insulating material, optionally, for example, benzocyclobutene (BCB), polyimide (PI), polybenzoxazole (PBO), polymer-based dielectric film, organic polymer film, or is made of other material having similar insulation and structural properties, by lamination, coating and printing, etc.

Preferably, the protective layer 107 has a Young's modulus in a range of 1,000 MPa to 20,000 MPa; more preferably, the protective layer 107 has a Young's modulus in a range of 1,000 MPa to 10,000 MPa; further preferably, the protective layer 107 has a Young's modulus in a range of 1,000 MPa to 7,000 MPa, 4,000 MPa to 7,000 MPa, or 4,000 MPa to 8,000 MPa; and in a most preferred embodiment, the protective layer 107 has a Young's modulus of 5,500 MPa.

Preferably, the protective layer 107 has a thickness in a range of 15 μm to 50 μm; more preferably, the protective layer 107 has a thickness in a range of 20 μm to 50 μm; in a preferred embodiment, the protective layer 107 has a thickness of 35 μm; in another preferred embodiment, the protective layer 107 has a thickness of 45 μm; and in still another preferred embodiment, the protective layer 107 has a thickness of 50 μm.

The protective layer 107 has the Young's modulus in the range of 1,000 MPa to 20,000 MPa; on one hand, the protective layer 107 is soft and has good flexibility and elasticity; on the other hand, the protective layer provides sufficient supporting force so that the protective layer 107 provides sufficient support for a conductive layer formed on the surface of the protective layer 107. Meanwhile, the protective layer 107 has the thickness in the range of 15 μm to 50 μm, it is ensured that the protective layer 107 provides sufficient buffering and support.

Particularly, in some types of chips, it is required not only that a thin die is packaged, but also that the conductive layer has a certain thickness suitable for a large electric flux; at this time, it is selected that the protective layer 107 has the thickness in the range of 15 μm to 50 μm and has the Young's modulus in the range of 1,000 MPa to 10,000 MPa. The soft and flexible protective layer 107 forms a buffer layer between the die 113 and the conductive layer formed on the surface of the protective layer, so that the conductive layer on the surface of the protective layer does not excessively press the die 113 and the die 113 is prevented from being broken under pressure of the thick and heavy conductive layer during the chip is used. Meanwhile, the protective layer 107 has a sufficient strength, so that the protective layer 107 provides sufficient support for the thick and heavy conductive layer.

In the case that the protective layer 107 has the Young's modulus in the range of 1,000 MPa to 20,000 MPa, especially in the case that the protective layer 107 has the Young's modulus in the range of 4,000 MPa to 8,000 MPa and has the thickness in the range of 20 μm to 50 μm, due to material properties of the protective layer 107, the protective layer 107 effectively protects the die against a pressure from a pin of a die bonder machine during a subsequent process of transferring the die.

The die transferring process is a reconstruction process of arranging and adhering the die 113 which has underwent the cutting and separating process onto the carrier 117; the die transferring process adopts the die bonder machine; the die bonder machine includes the pin; the die 113 on the wafer 100 is jacked up by the pin, and the die 113 which is jacked up is sucked by a bonder head, and then is transferred and bonded to the carrier 117.

During the process that the pin jacks up the die 113, the die 113, especially the thin die 113, is brittle and is easily broken under the jacking pressure of the pin, so the protective layer 107 having the above material properties protects the brittle die 113 to maintain integrity of the die 113 even under a relatively large jacking pressure.

Preferably, the protective layer 107 is an organic/inorganic composite material layer including filler particles. For example, the filler particles are inorganic oxide particles. For example, the filler particles are $SiO_2$ particles. In one embodiment, the filler particles in the protective layer 107 are two or more different types of inorganic oxide particles, for example, $SiO_2$ particles and $TiO_2$ particles mixed with each other. Preferably, the filler particles in the protective layer 107 such as the inorganic oxide particles, e.g., $SiO_2$ particles, e.g., $SiO_2$ particles and $TiO_2$ particles mixed with each other, are spherical or spheroidal. In a preferred embodiment, the filler particles in the protective layer 107 such as the inorganic oxide particles, e.g., $SiO_2$ particles, e.g., $SiO_2$ particles and $TiO_2$ particles mixed with each other, have a fill amount of 50% or more.

An organic material has advantages of easy operation and easy application, and the die 113 to be packaged is made of an inorganic material such as silicon; if the protective layer 107 is only made of the organic material, a difference between material properties of the organic material and material properties of the inorganic material may increase a difficulty in the packaging process and affect a packaging effect. By employing the organic/inorganic composite material in which the inorganic particles are added to the organic material, the material properties of the organic material is modified, so that the material of the protective layer 107 has properties of both the organic material and the inorganic material.

Especially with respect to a coefficient of thermal expansion (CTE), the silicon die 113 has a relatively low coefficient of thermal expansion, usually about 3 ppm/K, and the protective layer 107 is the organic/inorganic composite material layer including the filler particles to reduce the coefficient of thermal expansion of the protective layer, so that a difference in properties between the organic layer and the inorganic layer in the package structure is reduced.

In a preferred embodiment, in the case that T<Tg, the protective layer 107 has a coefficient of thermal expansion in a range of 3 ppm/K to 10 ppm/K; in a preferred embodiment, the protective layer 107 has a coefficient of thermal expansion of 5 ppm/K; in a preferred embodiment, the protective layer 107 has a coefficient of thermal expansion of 7 ppm/K; and in a preferred embodiment, the protective layer 107 has a coefficient of thermal expansion of 10 ppm/K.

In a subsequent molding process, the die 113 applied with the protective layer 107 expands and contracts correspondingly during heating and cooling processes of the molding process; in the case that the protective layer 107 has the coefficient of thermal expansion in the range of 3 ppm/K to 10 ppm/K, the protective layer 107 and the die 113 maintain a relatively uniform degree of expansion and contraction, so that an interface stress is not easily caused at a bonding interface between the protective layer 107 and the die 113, and thus the bonding between the protective layer 107 and the die 113 is not easily destroyed and the packaged chip structure is more stable.

The chip after being packaged often needs to undergo a thermal cycle during being used; in the case that the protective layer 107 has the coefficient of thermal expansion in the range of 3 ppm/K to 10 ppm/K, which is the same as or similar to the coefficient of thermal expansion of the die 113, the protective layer 107 and the die 113 maintain a relatively uniform degree of expansion and contraction in the thermal cycle, so that accumulation of interface fatigue at the interface between the protective layer 107 and the die 113 is avoided, and thus the packaged chip becomes more durable and a service life of the packaged chip is prolonged.

On the other hand, if the coefficient of thermal expansion of the protective layer is further reduced, the composite material of the protective layer 107 has to be filled with too many filler particles and the Young's modulus of the material is increased while the coefficient of thermal expansion is further reduced, so that the flexibility of the protective layer is reduced, resulting in excessively strong rigidity but a poor buffering effect of the protective layer 107. It is most preferable to limit the coefficient of thermal expansion of the protective layer to be 5 ppm/k to 10 ppm/k.

In the case that the protective layer opening is formed by laser patterning process, the filler particles in the protective layer 107 (for example, the inorganic oxide particles, such as $SiO_2$ particles) preferably have a diameter of less than 3 μm; preferably, the filler particles in the protective layer 107 (for example, the inorganic oxide particles, such as $SiO_2$ particles) have a diameter between 1 μm and 2 μm.

Controlling the diameter of the filler particles to be less than 3 μm facilitates the protective layer opening formed in the protective layer 107 by the laser patterning process to have a smoother side wall, so that the conductive material is sufficiently filled in the conductive material filling process, to avoid a case that, due to a side wall 109c of the protective layer opening 109 having large-sized unevenness, the protective layer opening cannot be filled by the conductive material at a lower side of the side wall that is shielded by a protrusion, and further avoid a case that a conductive property of the conductive filled via 124 is adversely affected.

Meanwhile, by controlling the diameter of the filler particles to be 1 μm to 2 μm, the filler particles with such small diameter will be exposed during the laser patterning process, so that the side wall 109c of the protective layer opening has a certain roughness; in this case, the side wall having a certain roughness and the conductive material have a larger contact area therebetween and thus contact each other more closely, so as to form the conductive filled via 124 with better conductivity.

The above-described diameter of the filler particles is an average value of the diameters of the filler particles.

Optionally, the protective layer 107 has a tensile strength in a range of 20 MPa to 50 MPa; and in a preferred embodiment, the protective layer 107 has a tensile strength of 37 MPa.

Optionally, after the process of applying the protective layer 107 to the wafer active surface 1001, the wafer back surface 1002 is ground to thin the wafer 100 to a desired thickness.

Modern electronic devices are small and lightweight, and thus the chip has a tendency of becoming thinner; in the step, the wafer 100 sometimes needs to be thinned to a very small thickness. However, it is very difficult to process and transfer the thin wafer 100, and a process of grinding and thinning the thin wafer 100 is also difficult, so it is usually difficult to thin the wafer 100 to a desired thickness. In the case that the surface of the wafer 100 has the protective layer 107, the protective layer 107 having the above material properties supports the wafer 100, so that the difficulties in processing, transferring and thinning the wafer 100 are reduced.

Step S3: cutting the wafer 100 applied with the protective layer 107 to form the die 113 having the protective layer 107.

As shown in FIG. 6a, the wafer 100 applied with the protective layer 107 is cut along a cutting line, to obtain a plurality of dies 113 formed with the protective layer; and the die 113 has a die active surface 1131 and a die back surface 1132.

As shown in FIG. 6b, the wafer 100 formed with the wafer conductive layer 130, applied with the protective layer 107 and formed with the protective layer opening 109 is cut along the cutting line, to obtain a plurality of dies 113; and the die 113 has the die active surface 1131 and the die back surface 1132.

As shown in the die schematic diagram A in FIG. 6b, the wafer conductive trace 106 interconnects and leads out a plurality of electrical connection pads 103 provided on the die active surface 1131.

As shown in the die schematic diagram B in FIG. 6b, the wafer conductive traces 106 respectively lead out the electrical connection pads 103 provided on the die active surface 1131.

As shown in FIG. 6c, the wafer 100 formed with the wafer conductive layer 130 and applied with the protective layer 107 is cut along the cutting line, to obtain a plurality of dies 113; and the die 113 has the die active surface 1131 and the die back surface 1132.

As shown in the die schematic diagram A in FIG. 6c, the wafer conductive trace 106 interconnects and leads out a plurality of electrical connection pads 103 provided on the die active surface 1131.

As shown in the die schematic diagram B in FIG. 6c, the wafer conductive traces 106 respectively lead out the electrical connection pads 103 provided on the die active surface 1131.

As shown in the die schematic diagram C in FIG. 6c, the wafer conductive stud 111 is directly formed at the electrical connection pad 103 provided on the wafer active surface 1001, and leads out the electrical connection pad 103.

Optionally, before the step of cutting the wafer 100 to separate out the dies 113, the method further comprises: performing plasma surface treatment on the surface, applied with the protective layer 107, of the wafer 100 to increase surface roughness, so that adhesiveness of the die 113 to the carrier 117 in a subsequent process is increased and thus position shift of the die under the package pressure is less likely to occur.

Due to the material properties of the protective layer, the die 113 which is separated out in the process of cutting the wafer 100 has no burrs and chippings.

It should be understood that, if the process permits, the wafer conductive layer 130 and/or the protective layer 107 for example are/is formed on the die active surface 1131 of each die 113 after the wafer 100 is cut into the dies 113 to be packaged according to specific practical situations. The wafer conductive layer 130 refers to a conductive layer formed before the die 113 obtained by cutting the wafer 100 is adhered to the carrier.

Step S4: providing a metal structure.

Figure 7:
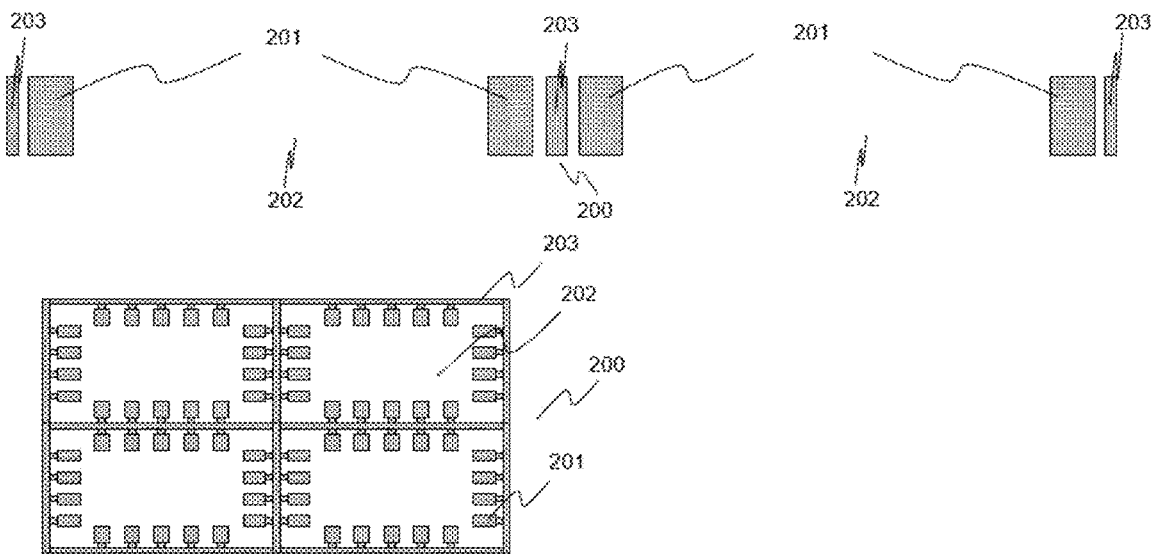

According to the embodiment shown in FIG. 7, the metal structure is a metal frame 200, and the metal frame 200 comprises an array of metal units. The metal frame 200 for example is an existing lead frame in the industry, or is formed by etching or mechanical stamping one sheet or one block of metal piece according to actual needs. The metal piece to be patterned for example is made of a single metal such as copper, or an alloy. A surface of the metal piece for example is partially or completely coated with a second metal such as nickel and/or gold, to protect the metal piece from environmental erosion such as oxidation. A thickness of the metal piece is not less than the thickness of the die 113. The metal piece to be patterned for example has a shape of a rectangle, or a square, or other shape. As shown in FIG. 7, the metal piece is patterned to include 4 identical metal units and each of the metal units has a rectangular outer contour; however, such design is exemplary, the amount of the metal units is not limited to 4 and may be set according to actual needs, and the metal unit may have a shape of a rectangle, or other shape. A blank region in the metal unit indicates a region in which the metal is completely etched away, a reserved metal portion includes a metal feature, and different metal features bring different performance improvements.

In FIG. 7, the metal feature includes at least one connection pad 201; these connection pads 201 are arranged on an inner side of an outer contour edge of the metal frame 200, or are arranged at other position according to actual needs; and the connection pads 201 are connected by a connection bar 203 made of the metal that is not etched away. The connection pad 201 is a pin of the packaged die; according to the present disclosure, after the die 113 is packaged, the connection pads 201 are in an exposed state, and the packaged die 113 is soldered to a circuit board through these connection pads 201, to implement connection of the packaged die 113 with other circuit elements. The connection bar 203 is reserved during the metal piece is patterned to ensure that the connection pads 201 and some other features formed by patterning are connected with the outer contour edge of the metal frame 200, so that it is ensured that the features patterned on the metal frame 200 will not fall during transferring the metal frame 200. Optionally, the metal piece is firstly affixed onto a temporary support for patterning, and after the patterning is completed, the metal frame is transferred by means of the temporary support; in this case, it is not necessary to form a connection line/the connection bar.

Each metal unit in the metal frame 200 shown in FIG. 7 includes a vacancy 202; the vacancy 202 is shown as the blank region in the drawing; and the blank region is formed by completely etching away a portion of the metal piece and has an area larger than a surface area of the die 113, to facilitate adhering the die 113 and the metal frame 200 to the carrier without the metal frame 200 contacting the die 113 in a subsequent step. According to the example in the drawing, each metal unit includes the vacancy 202; in another example, one metal unit for example includes two or more vacancies 202, and each vacancy 202 accommodates one or more dies 113. Adjacent metal units have a common outer contour edge, as shown in FIG. 7, a metal unit at an upper left corner respectively has a common outer contour edge with a metal unit on a right side thereof and a metal unit on a lower side thereof, so that all the metal units are connected into a whole.

The metal frame 200 according to the present disclosure shown in FIG. 7 is merely exemplary; an entirety of the metal piece for example has an area equal to a surface area of the carrier 117, and has a shape identical to a shape of the carrier 117, which is preferably a rectangle or an oblong or is designed into other shape according to actual needs. However, it is found in experiments that, in a case where the area of the carrier 117 is relatively large, if the metal piece as large as the carrier 117 is employed to form the metal frame 200 by etching, it is easily deformed in a transferring process and is difficult to operate because the metal piece is relatively thin with a larger area. Therefore, preferably, two or more metal pieces having a sum of areas equal to the surface area of the carrier 117 are employed, and one or more metal frames 200 is formed on each metal piece by etching; and in a fabrication process, the metal pieces each of which has been etched are sequentially arranged on the carrier 117, and then put together to obtain area equal to the surface area of the carrier 117.

Step S5: providing the die 113 having the protective layer 107 and the metal structure onto the carrier 117.

Figure 8A:
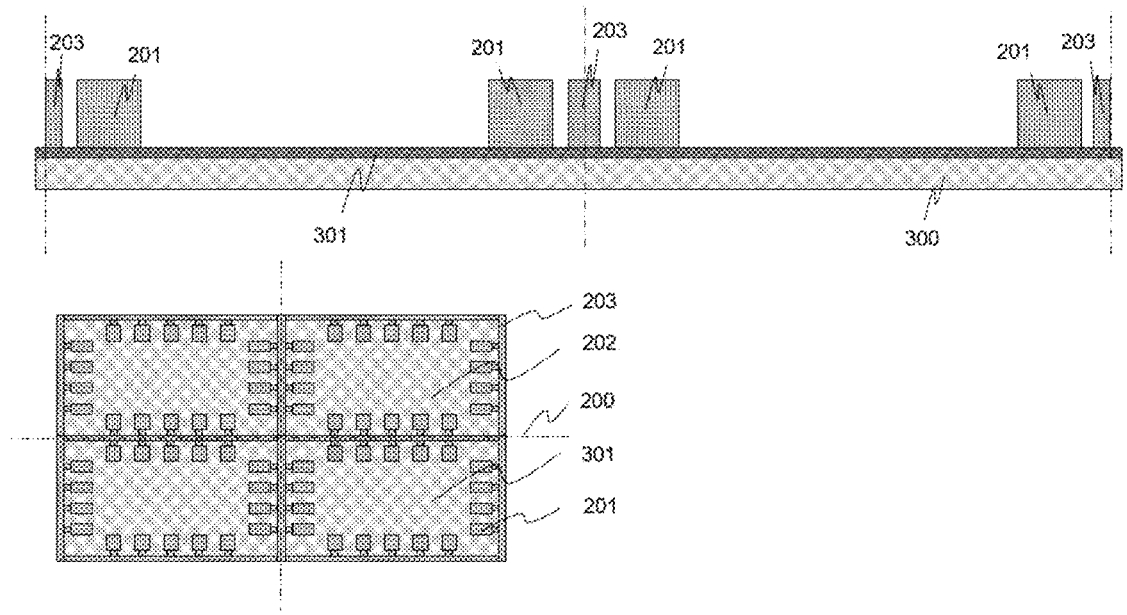
Figure 8B:
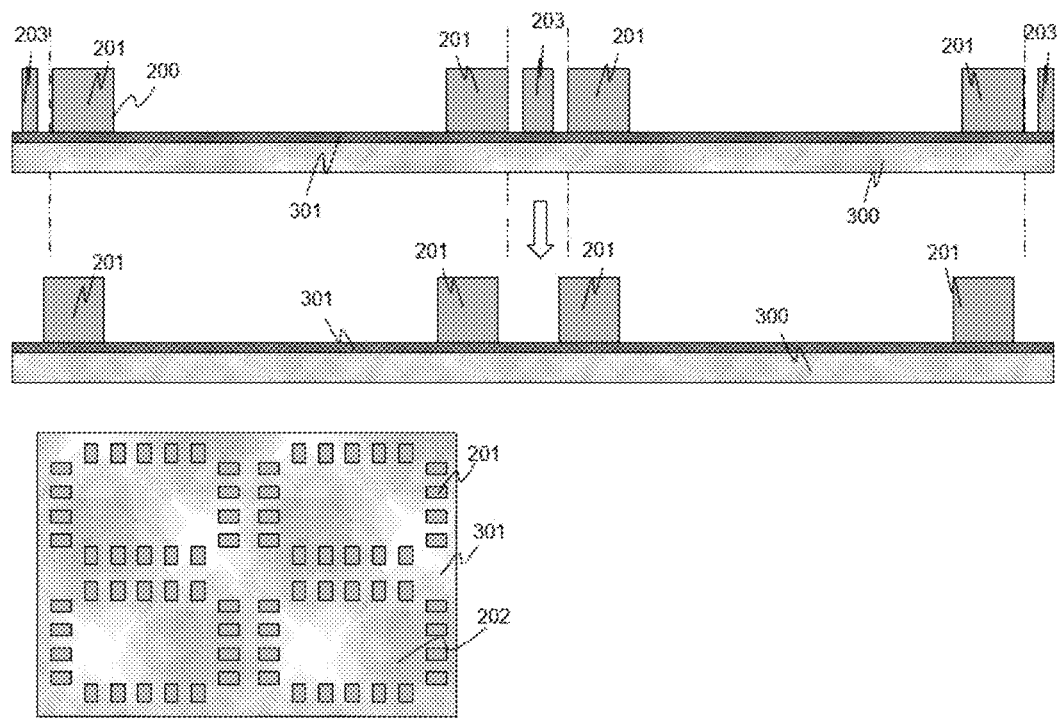
Figure 9:
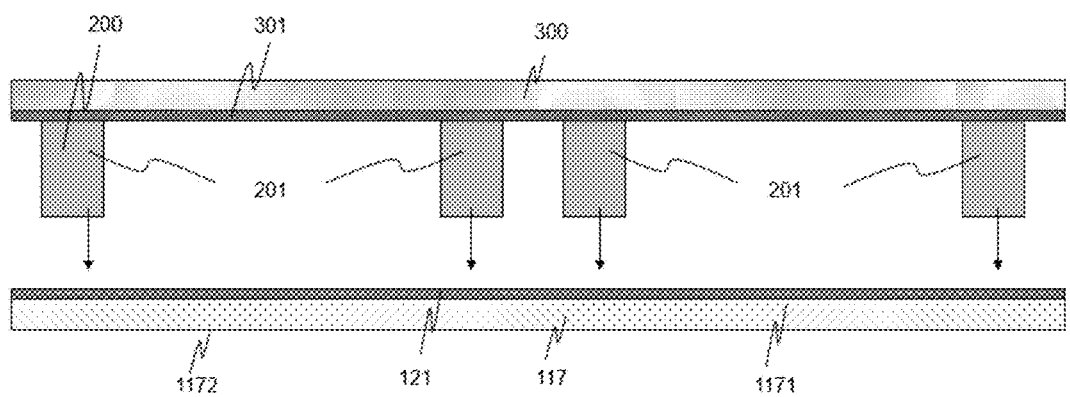

FIG. 8a to FIG. 9 show a preferred implementation mode of providing the metal frame onto the carrier in step S5.

Because the metal frame 200 is relatively thin, especially in the case that the area is relatively large, the metal frame 200 is easily bent and deformed during the metal frame 200 is taken and placed; so in order to more conveniently adhere the metal frame 200 to the carrier 117 accurately while keeping the metal frame 200 flat, a mode below for example is employed.

As shown in FIG. 8a and FIG. 8b, a temporary support 300 is provided, an adhesive layer 301 is formed on a surface of the temporary support 300, and the patterned metal frame 200 is affixed to the temporary support 300 by adhering; optionally, the temporary support 300 is omitted, the adhesive layer 301 with a large thickness is used directly as the temporary support 300 to transport the patterned metal frame 200. Preferably, the temporary support 300, the adhesive layer 301 and the carrier 117 are same in shape and size.

Preferably, as shown in FIG. 8a, after the metal frame 200 is adhered onto the temporary support 300, the connection bar 203 is cut to separate the metal frame 200. Optionally, each of the connection bars 203 connecting the respective metal units is cut, so that the metal units adhered onto the temporary support 300 are separated from one another; or the connection bars 203 within a certain region are cut to separate the entire metal frame 200 on the temporary support 300 into two portions, four portions, six portions, or any other number of portions. Preferably, a cutting line is along a central line of the connection bar 203. The method has advantages that: during the packaging process, it is often necessary to perform heating and cooling processes; if the entire metal frame 200 is separated into units having a smaller area or the entire metal frame 200 is directly separated into the metal units independent of each other, then during the heating and cooling processes in the packaging process, the metal frame 200 having a smaller area or the metal unit expand and contract independently, and a degree of expansion and contraction of each unit is small due to the smaller area, so that it is easier to control and operate the packaging process.

Preferably, as shown in FIG. 8*b*, after the metal frame 200 is adhered onto the temporary support 300, the connection bars 203 are separated and removed from the metal frame 200, so as to separate the metal units in the metal frame 200; as shown in FIG. 8*b*, the connection pads 201 become portions independent of each other. Because the features on the metal frame are independent of each other, a panel-level test for example is performed prior to cutting, which greatly reduces costs and time for tests.

As shown in FIG. 9, the carrier 117 is provided, and the carrier 117 has a carrier front surface 1171 and a carrier back surface 1172. The carrier 117 for example has a shape of a circle, a triangle, a quadrangle or any other shape; the carrier 117 for example has a size of a small-sized wafer substrate, or has various sizes, particularly is a large-sized rectangular carrier; and the carrier 117 for example is made of metal, non-metal, plastic, resin, glass and stainless steel, etc. Preferably, the carrier 117 is a large-sized quadrangular stainless steel panel.

The carrier 117 has the carrier front surface 1171 and the carrier back surface 1172, and the carrier front surface 1171 is a flat surface.

The die 113 is bonded and fixed onto the carrier 117 by the adhesive layer 121.

The adhesive layer 121 for example is formed on the carrier front surface 1171 by lamination, printing, spraying and coating, etc. In order to facilitate separation of the carrier 117 from the die 113 whose back side has been packaged in a subsequent process, the adhesive layer 121 is preferably made of a material capable of being easily separated, for example, a thermal-releasing material.

A side of the temporary support 300 that is adhered with the metal frame 200 faces the carrier front surface 1171; the temporary support 300 has a surface area equal to the surface area of the carrier 117, and a shape same as that of the carrier 117; the temporary support 300 and the carrier 117 are aligned to get in contact with each other, the metal frame 200 is affixed onto the adhesive layer 121, then the temporary support 300 is peeled off, and the adhesive layer 301 on the metal frame 200 is removed, so as to complete the affixing of the metal frame 200 onto the carrier 117.

In the step, preferably, the metal frame 200 is aligned onto the carrier 117 by alignment marks (not shown) previously formed on the carrier 117 and the metal frame 200, and the metal frame 200 is adhered onto the carrier 117 by the adhesive layer 121.

In addition, optionally, a metal foil or a metal sheet for example is adhered to the temporary support 300 by the adhesive layer 301 provided on the temporary support 300, then the metal foil or the metal sheet is etched into a desired pattern to form the patterned metal frame 200, and then the metal frame 200 is transferred onto the carrier 117.

A surface of the metal frame 200 that faces the carrier 117 is defined as a metal frame front surface, and a surface that faces away from the carrier 117 is defined as a metal frame back surface. A metal structure front surface and a metal structure back surface, a metal unit front surface and a metal unit back surface, a metal feature front surface and a metal feature back surface are defined in same way.

Figure 10:
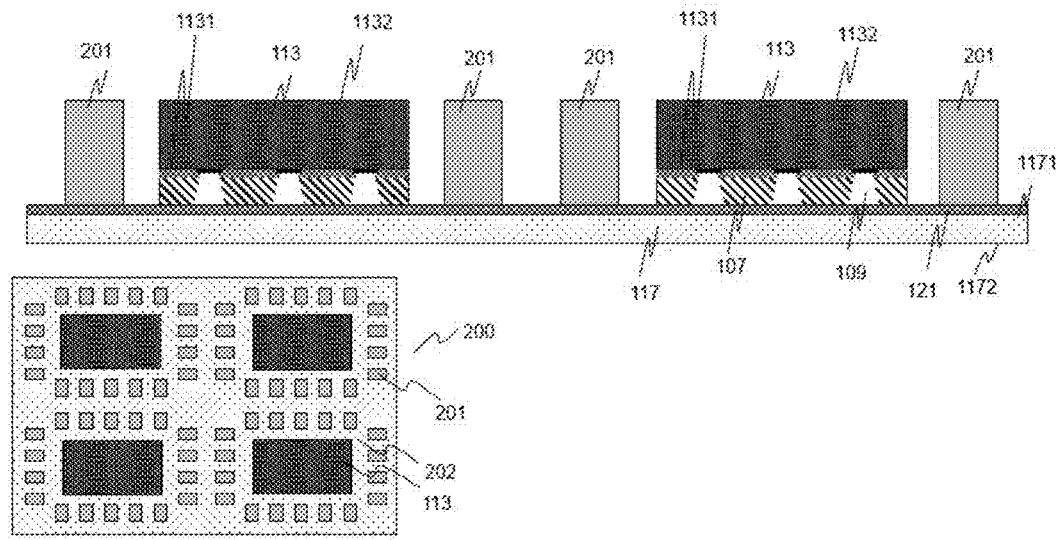

FIG. 10 shows an implementation mode of providing the die 113 onto the carrier 117 in step S5.

Because the metal frame 200 which is embodied as the connection pads 201 in FIG. 10 has been adhered onto the adhesive layer 121 provided on the carrier front surface 1171, it should be ensured that the die 113 does not get in contact with the metal frame 200 during the die 113 is adhered; in the present disclosure, the die 113 is adhered in the vacancy 202 of the metal frame 200; optionally, one vacancy 202 corresponds to one die 113 or one vacancy 202 corresponds to two or more dies 113. Preferably, a position mark for arranging the die 113 is provided on the carrier 117, the mark for example is formed on the carrier 117 by laser, mechanical patterning, etc.; and meanwhile, an alignment mark is provided on the die 113 to aim for and align with a position for adhering on the carrier 117 during adhering. FIG. 10 is merely an exemplary diagram, and only shows that the die 113 adhered onto the adhesive layer 121 of the carrier 117 is in a form of the die having the protective layer 107 and the protective layer opening as shown in FIG. 6*a*. The die adhered onto the adhesive layer 121 of the carrier 117 may be in a form of the die having the wafer conductive layer 130 and the protective layer 107 as well as the protective layer opening 109 as shown in FIG. 6*b*, or may be in a form of the die having the wafer conductive layer 130 and the protective layer 107 as shown in FIG. 6*c*. Meanwhile, the metal frame 200 adhered on the adhesive layer 121 may be the metal frame 200 which only has the connection bar 203 cut but not removed as shown in FIG. 8*a*, or may be the metal frame 200 having a complete connection bar 203.

As shown in FIG. 10, one metal unit corresponds to one die 113, the amount of the dies 113 on the carrier 117 is equal to the amount of the metal units on the carrier 117, and an arrangement mode of the dies 113 corresponds to an arrangement mode of the metal units on the carrier 117. The amount of the metal units and the arrangement mode of the metal units are not limited to those shown in FIG. 10, but may be designed according to actual needs.

In addition, one metal unit for example corresponds to two or more dies 113, and the plurality of dies 113 are placed in the pre-formed vacancy 202; particularly, the two or more dies are two or more dies having different functions, the plurality of dies are arranged in the metal unit on the carrier 117 according to actual product requirements, then are packaged, and further are cut into a plurality of package bodies after packaging is completed; and thus, one package body includes the plurality of dies so as to form a multi-chip module (MCM), and positions of the plurality of dies may be freely set according to actual product requirements.

A mounting order shown in FIG. 9 to FIG. 10 is that: firstly, the metal frame 200 is mounted on the carrier 117, and then the die 113 is mounted on the carrier 117; however, this is merely exemplary, and the mounting order may be that: firstly, the die 113 is mounted on the carrier 117, and then the metal frame 200 is mounted on the carrier 117.

Step S6: forming a molding layer 123 on the carrier 117.

Figure 11:
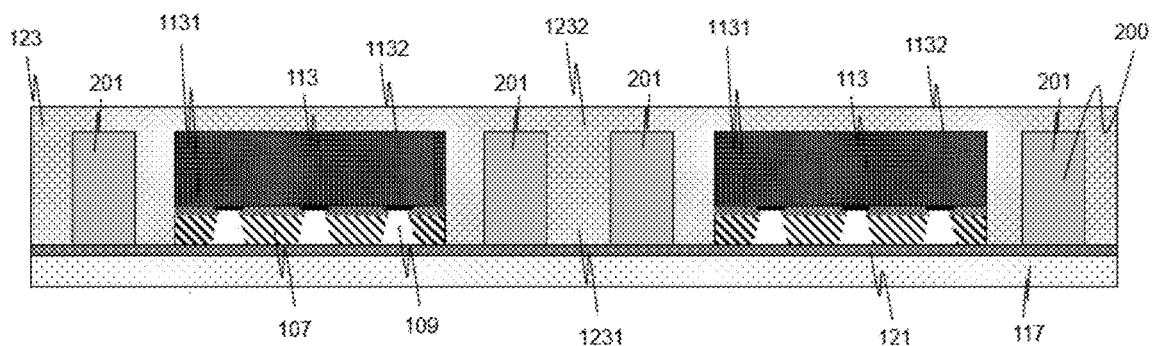

As shown in FIG. 11, the molding layer 123 covers the entire carrier 117 to encapsulate all of the dies 113 and the metal frames 200 (each of the metal frames 200 is embodied as the connection pads 201 in FIG. 11), so as to reconstruct a flat-plate structure; after the carrier 117 is peeled off, a subsequent packaging step is continued on the reconstructed flat-plate structure.

A surface of the molding layer 123 that is in contact with the carrier front surface 1171 or the adhesive layer 121 is defined as a molding layer front surface 1231. A surface of the molding layer 123 that faces away from the carrier front surface 1171 or the adhesive layer 121 is defined as a molding layer back surface 1232.

Preferably, the molding layer front surface 1231 and the molding layer back surface 1232 are substantially flat and parallel to the carrier front surface 1171.

The molding layer 123 for example is formed by paste printing, injection molding, hot press molding, compression molding, transfer molding, liquid sealant molding, vacuum lamination, or other suitable mode of molding. The molding layer 123 for example is made of an organic composite material, a resin composite material, a macromolecule composite material, a polymer composite material, such as an epoxy resin having a filler, an Ajinomoto buildup film (ABF) or other polymer having a suitable filler.

In one embodiment, the molding layer 123 is made of an organic/inorganic composite material by compression molding.

Optionally, before the molding layer 123 is formed, some pre-treatment processes such as chemical cleaning process and plasma cleaning process are performed to remove impurities on the surfaces of the die 113 and the metal frame 200, so that the molding layer 123 is bonded with the die 113, the metal frame 200 and the carrier 117 more closely without delamination or cracking.

Preferably, the molding layer 123 has a coefficient of thermal expansion in a range of 3 ppm/K to 10 ppm/K; in a preferred embodiment, the molding layer 123 has a coefficient of thermal expansion of 5 ppm/K; in another preferred embodiment; the molding layer 123 has a coefficient of thermal expansion of 7 ppm/K; and in still another preferred embodiment, the molding layer 123 has a coefficient of thermal expansion of 10 ppm/K.

Preferably, the molding layer 123 and the protective layer 107 have a same or similar coefficient of thermal expansion. The coefficient of thermal expansion of the molding layer 123 is selected to be 3 ppm/K to 10 ppm/K, and is selected to be the same as or similar to the coefficient of thermal expansion of the protective layer 107; during heating and cooling processes of the molding process, the protective layer 107 and the molding layer 123 have a uniform degree of expansion and contraction, so that an interface stress is not easily caused between the protective layer 107 and the molding layer 123; and such low coefficient of thermal expansion of the molding layer allows the molding layer, the protective layer and the die to have coefficients of thermal expansion close to one another, so that the molding layer 123, the protective layer 107 and the die 113 are bonded closely at the interfaces therebetween, to avoid their separations at the interfaces therebetween.

The packaged chip usually needs to undergo the thermal cycle during being used; in the case that the protective layer 107, the molding layer 123 and the die 113 have coefficients of thermal expansion close to one another, the protective layer 107, the molding layer 123 and the die 113 have little interface fatigue in the thermal cycle, and an interface gap is less likely to occur between the protective layer 107, the molding layer 123 and the die 113, so that a service life of the chip is prolonged and an application field of the chip is widen.

A difference in the coefficients of thermal expansion between the die 113 and the molding layer 123 may cause warpage of the panel after the molding process is completed; due to the warpage phenomenon, it is difficult to accurately position the die 113 in the panel in a subsequent process of forming the conductive layer, which thus has a great impact on the process of forming the conductive layer.

Particularly, in a large panel packaging process, because a size of the panel is relatively large, even slight panel warpage may cause the die in an outer peripheral portion of the panel that is away from a center of the panel to generate a greater position change as compared with the position of the die before being molded; so in the large panel packaging process, solving the warpage problem becomes one of key points of the whole process; and the warpage problem even limits magnification development of the size of the panel and becomes a technical barrier in the packaging process of the large-sized panel.

The coefficients of thermal expansion of the protective layer 107 and the molding layer 123 are limited to the range of 3 ppm/K to 10 ppm/K, and preferably, the molding layer 123 and the protective layer 107 have the same or similar coefficient of thermal expansion, so that occurrence of warpage of the panel is effectively avoided and the packaging process of the large panel is implemented.

Meanwhile, during the molding process, because the package pressure exerts a pressure, which is toward the carrier 117, onto the back side of the die 113, the pressure tends to press the die 113 into the adhesive layer 121, so that the die 113 sinks into the adhesive layer 121 in the process of forming the molding layer 123; after the molding layer 123 is formed, the die 113 and the molding layer front surface 1231 are not located in a same plane, and the surface of the die 113 protrudes beyond the molding layer front surface 1231 to form a stepped structure; during a subsequent process of forming the panel-level conductive layer, the panel-level conductive layer also has a corresponding stepped structure, which makes the package structure unstable.

In the case that the die active surface 1131 has the protective layer 107 with the above material properties, the protective layer 107 acts as a buffer under the package pressure to avoid the die 113 from sinking into the adhesive layer 121, so as to avoid generation of the stepped structure on the molding layer front surface 1231.

Figure 12:
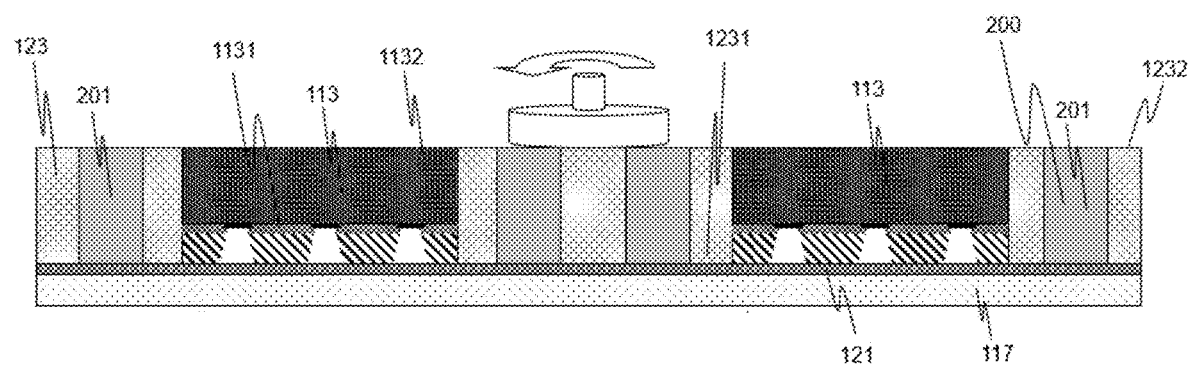

In order to expose the metal frame 200, it is further necessary to thin the molding layer 123, for example, the molding layer 123 is thinned by mechanically grinding or polishing the molding layer back surface 1232, so that the molding layer 123 is thinned to the back surface of the metal frame 200 to expose features on the surface of the metal frame 200. As shown in FIG. 12, in the case that a thickness of the metal frame 200 is thicker than that of the die 113, the molding layer for example is further thinned to the back surface of the die 113, so that the back surface of the metal frame 200 and the back surface of the die 113 are both exposed.

Step S7: peeling off the carrier 117 to form a panel assembly 150.

After the carrier 117 is peeled off, the protective layer 107 on the die active surface 1131, the lower surface of the metal frame 200, and the molding layer front surface 1231 are exposed.

After the carrier 117 is removed, a structure in which the molding layer 123 encapsulates the die 113 and the metal frame 200 is defined as the panel assembly 150.

Step S8: forming a panel-level conductive layer and a dielectric layer 129.

The panel-level conductive layer is formed on the surface of the protective layer 107, and the panel-level conductive layer is connected with the electrical connection pad 103 provided on the die active surface 1131 through the wafer conductive layer 130 and/or the conductive filled via 124, and is further connected with the metal frame 200. The dielectric layer 129 is formed on the panel-level conductive layer, and the dielectric layer 129 is used to encapsulate and protect the panel-level conductive layer. The panel-level conductive layer for example comprises one layer or a plurality of layers, and the dielectric layer 129 for example comprises one layer or a plurality of layers.

Figure 13:
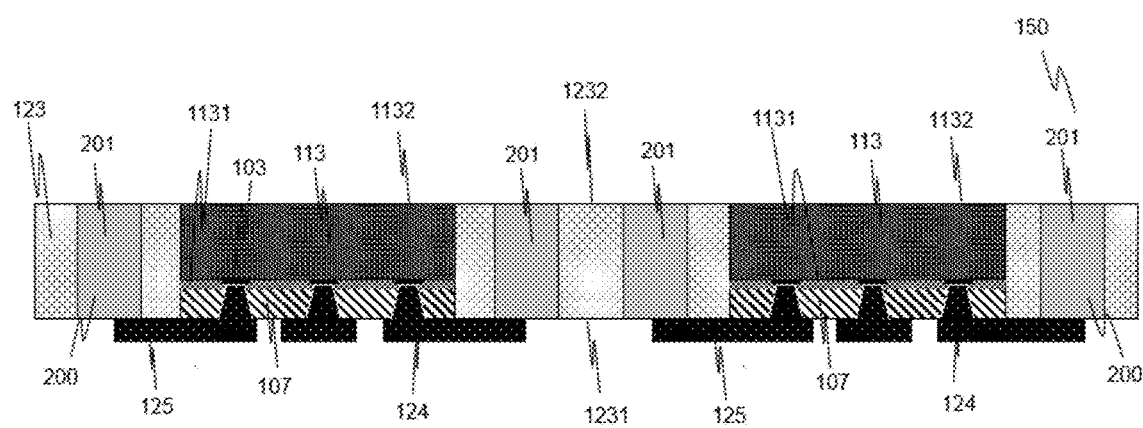

As shown in FIG. 13, the panel-level conductive layer is a panel-level conductive trace 125 in the drawing; because the conductive filled via 124 has not been formed as shown in FIG. 13, optionally, the conductive filled via 124 and the panel-level conductive trace 125 are formed in a same step for forming conductive layer. The conductive filled via 124 and the panel-level conductive trace 125 are formed by using a method for forming a patterned conductive layer. The conductive filled via 124 and the panel-level conductive trace 125 for example are made of a material such as copper, gold, silver, tin and aluminum or a combination thereof, or made of other suitable conductive material by PVD, CVD, sputtering, electrolytic electroplating, electrodeless electroplating, or other suitable metal deposition process.

At least a part of the panel-level conductive traces 125 are connected with the electrical connection pad 103 provided on the die active surface 103 through the conductive filled via 124 and are connected with the connection pad 201; the panel-level conductive trace 125 leads the electrical connection pad 103 provided on the die active surface to the connection pad 201 through the conductive filled via 124.

A pattern of the panel-level conductive trace 125 in FIG. 13 is merely exemplary, and the pattern of the panel-level conductive trace 125 may be designed according to specific circuit design.

Optionally, the conductive filled via 124 and the panel-level conductive trace 125 are formed in different steps so as to firstly form the conductive filled via 124 and then form the panel-level conductive trace 125.

In the case that the conductive filled via 124 has been formed in the preceding step of applying the protective layer, the step of forming the panel-level conductive layer is directly performed.

In the case that the protective layer opening 109 has not been formed in the preceding step of applying the protective layer, it is necessary to include a step of forming the protective layer opening 109.

Figure 14:
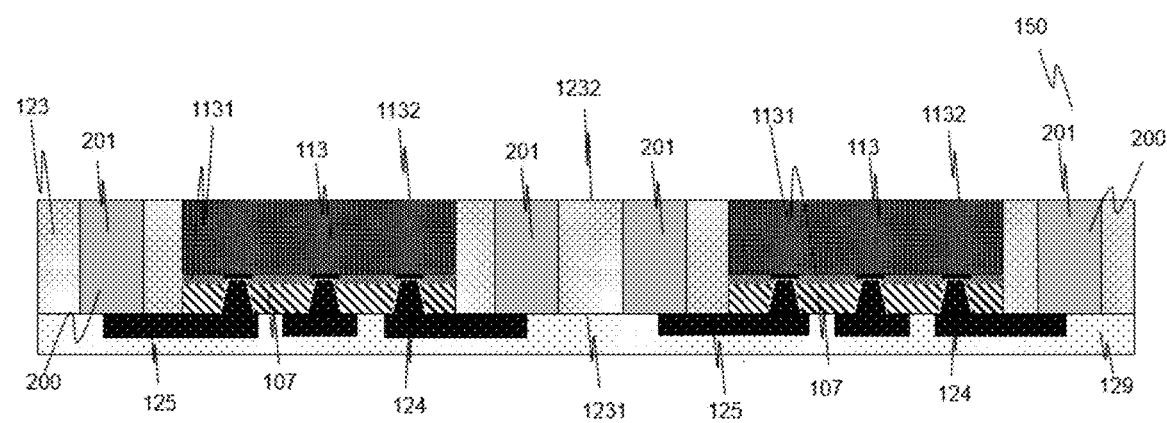

As shown in FIG. 14, the dielectric layer 129 is formed on the panel-level conductive trace 125.

The dielectric layer 129 is formed on the surface of the panel-level conductive layer by lamination, coating, spraying, printing, molding, or other suitable method.

The dielectric layer 129 for example is made of benzocyclobutene (BCB), polyimide (PI), polybenzoxazole (PBO), Ajinomoto Build up Film (ABF), silicon dioxide, silicon nitride, silicon oxynitride, tantalum pentoxide, aluminum oxide, polymer-based dielectric film, organic polymer film; or is made of an organic composite material, a resin composite material, a macromolecule composite material, a polymer composite material, such as an epoxy resin having a filler, ABF, or other polymer having a suitable filler; or is made of other material having similar insulation and structural properties. In a preferred embodiment, the dielectric layer 129 is made of ABF. The dielectric layer 129 is insulating and plays a role of protecting the conductive layer.

As shown in FIG. 14, a height of the dielectric layer 129 is larger than a height of the panel-level conductive trace 125, and the dielectric layer 129 completely encapsulates the panel-level conductive trace 125.

Due to the presence of the protective layer 107, the step of forming the panel-level conductive layer is directly performed after the molding process is completed, so that the case that the step of forming the panel-level conductive layer does not have to be performed after the insulating layer is formed is avoided after the molding process the completed.

Each of the panel-level conductive layer and the dielectric layer 129 shown in FIG. 13 and FIG. 14 comprises only one layer, but optionally, each of the panel-level conductive layer and the dielectric layer for example comprises a plurality of layers.

In the case that each of the panel-level conductive layer and the dielectric layer comprises a plurality of layers, steps of forming the plurality of panel-level conductive layers and the plurality dielectric layers for example are as follows:

Forming a first panel-level conductive trace on the surface of the protective layer, and forming a first panel-level conductive stud on an electrical connection pad of the first panel-level conductive, the first panel-level conductive stud being used to connect and lead out the first panel-level conductive trace;

Forming a first dielectric layer on the first panel-level conductive trace and the first panel-level conductive stud, to encapsulate the first panel-level conductive trace and the first panel-level conductive stud and expose the surface of the first panel-level conductive stud;

Forming a second panel-level conductive trace connected with the first panel-level conductive stud on the surface of the first dielectric layer, and completely packaging the second panel-level conductive trace by a second dielectric layer.

At this time, the package structure having two panel-level conductive layers and two dielectric layers is formed.

So on and so forth, the package structure having the plurality of panel-level conductive layers and the plurality of dielectric layers is formed.

In the case that each of the panel-level conductive layer and the dielectric layer comprises a plurality of layers, steps of forming the plurality of panel-level conductive layers and the plurality dielectric layers for example are as follows:

Forming the first panel-level conductive trace on the surface of the protective layer;

Forming the first dielectric layer on the first panel-level conductive trace, a thickness of the first dielectric layer being larger than a thickness of the first panel-level conductive trace to completely encapsulate the first panel-level conductive trace;

Forming an opening in the first dielectric layer by the laser patterning process or the photolithography patterning process, the opening being formed on the electrical connection pad of the first panel-level conductive trace to expose the electrical connection pad of the first panel-level conductive trace.

By using a conductive material, filling the opening and forming a second panel-level conductive trace on the first dielectric layer and at a position corresponding to the filled opening;

Forming a second dielectric layer on the second panel-level conductive trace, a thickness of the second dielectric layer being larger than a thickness of the second panel-level conductive trace to completely encapsulate the second panel-level conductive trace by the second dielectric layer.

At this time, the package structure having two panel-level conductive layers and two dielectric layers is formed.

So on and so forth, the package structure having the plurality of panel-level conductive layers and the plurality of dielectric layers is formed.

In the case that each metal unit of the metal frame 200 corresponds to two or more dies 113, particularly, in the case that the plurality of dies have different functions, they are packaged into the multi-chip module having the metal features, and a pattern of the panel-level conductive layer of the plurality of dies is designed according to electrical connection requirements of actual products. The packaged chip structure is shown in FIG. 29e.

In step S8, during forming the panel-level conductive layer and the dielectric layer 129 on the surface of the protective layer 107 of the die 113, FIG. 13 and FIG. 14 show that the die 113 shown in FIG. 6a is packaged. It should be understood that, the packaging may be performed on the die shown in FIG. 6b. The protective layer opening 109 is filled with the conductive material to form the conductive filled via 124; at least one of the conductive filled vias 124 are connected with the wafer conductive trace 106 so that the wafer conductive trace 106 is led out from the protective layer 107; the panel-level conductive trace 125 is formed on the surface of the protective layer 107, preferably, the conductive filled via 124 and the panel-level conductive trace 125 are formed in a same step for forming metal layer. At least a part of the panel-level conductive traces 125 are connected with at least one of the conductive filled vias 124, and are further connected with at least a part of connection pads 201 of the metal frame 200; the electrical connection pad 103 provided on the die active surface 1131 is led to the connection pad 201 of the metal frame 200 through the wafer conductive layer 130, the conductive filled via 124 and the panel-level conductive trace 125, so as to implement electrical connection of the electrical connection pad 103 with the external circuit through the connection pad 201. It should be understood that, the packaging may be performed on the die shown in FIG. 6c. The panel-level conductive trace 125 is formed on the surface of the protective layer 107; at least a part of the panel-level conductive trace 125 is connected with the wafer conductive stud 111, and further is connected with at least a part of the metal frame 200; and the electrical connection pad 103 provided on the die active surface 1131 is led to the connection pad 201 of the metal frame 200 through the wafer conductive layer 130 and the panel-level conductive layer, so as to implement the electrical connection of the electrical connection pad 103 with the external circuit.

Step S9: cutting to form a plurality of chips 500.

Figure 15:
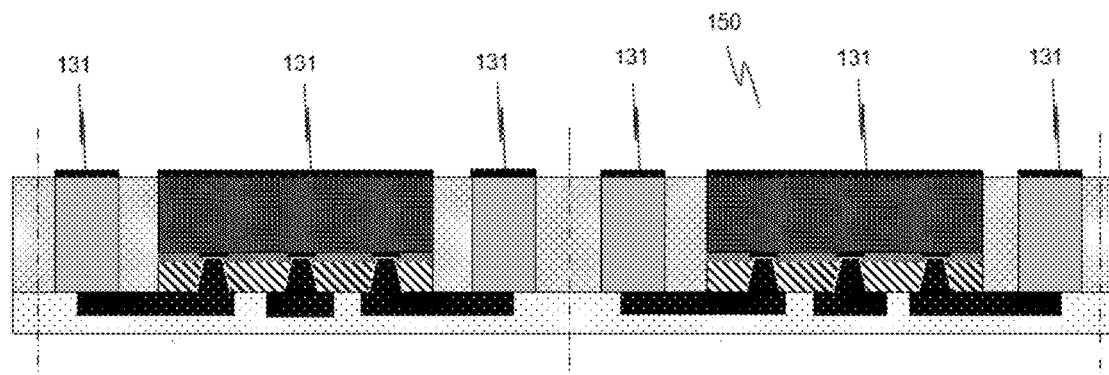

As shown in FIG. 15, a package single body is separated out by cutting to form the packaged chip, and the cutting for example is performed by employing machinery or laser.

In the case that the packaged metal frame 200 is the metal frame 200 including the connection bar 203 as shown in FIG. 8a, during this cutting and separating process, it is necessary to perform cutting on the connection bar 203 to remove the connection bar 203, so that the connection bar is not included in the packaged chip 500 after the packaging is completed, and the metal features in the metal unit of the metal frame 200 are all independent from each other.

Preferably, before or after the step of cutting and separating, a surface treatment layer 131 is formed on the die back surface 1132 and/or the exposed surface of the metal frame optionally by electroplating, electrodeless electroplating, or other suitable method; for example, the surface treatment layer 131 is formed by electroless nickel electroless palladium immersion gold (ENEPIG) or tin plating (Tin).

Optionally, the surface treatment layer 131 is further configured to implement back grounding of the chip 500, that is, the surface treatment layer 131, according to specific design of the circuit, electrically connects the die back surface 1132 to a special connection pad 201 for implementing back grounding (the special connection pad for implementing back grounding is: the connection pad that is connected with the electrical connection pad having its back surface grounded and provided on the die active surface through a conductive structure).

In the present disclosure, Embodiment 2 differs from Embodiment 1 mainly in the structure of the metal frame 200, other identical parts will not be repeated, and only parts different from Embodiment 1 will be described in this embodiment.

Figure 16:
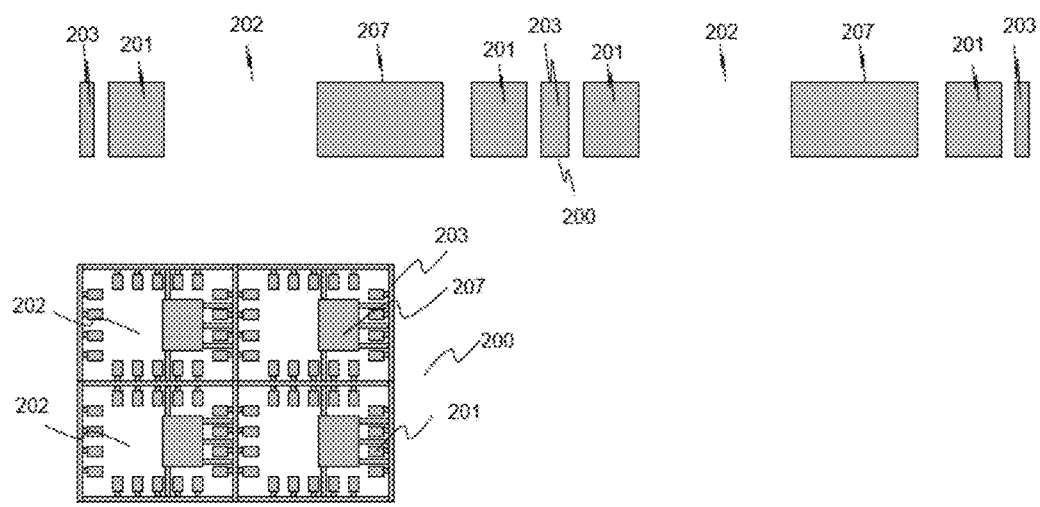
FIG. 16 to FIG. 20 are schematic diagrams of the chip packaging method according to another exemplary embodiment of the present disclosure.

FIG. 16 shows a structural diagram of the metal frame 200 according to Embodiment 2 of the present disclosure. On a basis that the metal feature of the metal frame 200 is the connection pad 201 according to Embodiment 1, the metal feature of the metal frame 200 in Embodiment 2 further includes a heat dissipation structure for dissipating heat; the heat dissipation structure is a heat dissipation pad 207 in FIG. 16; if the condition permits, the heat dissipation pad 207 has an area as large as possible to improve a heat dissipation effect; a shape of the heat dissipation pad 207 is not limited to a rectangle as shown in the drawing, it may be a square or other shape; and the amount of heat dissipation pad 207 is not limited to one, and may be two or more according to needs. In order that the heat dissipation pad 207 does not break away from the metal frame 200, one or more connection bars 203 are reserved between the heat dissipation pad 207 and the outer contour edge of the metal frame 200 to ensure that the heat dissipation pad 207 and the metal frame 200 are connected together during transferring the metal frame 200. In the mode as described in Embodiment 1, optionally, the metal piece is firstly fixed to the temporary support 300 and then the metal frame 200 is formed, then it is not necessary to form the connection bar 203; such case is also applicable in this embodiment.

During transferring the metal frame 200, the metal frame 200 is transported by employing the temporary support 300 and/or the adhesive layer 301 in the mode as described in Embodiment 1. After the metal frame 200 is adhered onto the temporary support 300, the connection bar 203 is cut to separate the metal frame 200, or the connection bar 203 is removed from the metal frame 200 so as to separate the metal units in the metal frame 200.

The step of forming the protective layer according to Embodiment 2 is: referring to FIG. 3a to FIG. 3b, applying the protective layer 107 on the wafer active surface 1001; and forming the protective layer opening 109 on the surface of the protective layer 107. At least a part of the protective layer openings 109 are formed at positions corresponding to the electrical connection pads 103 on the wafer active surface 1001 and/or at heat dissipation positions on the wafer active surface 1001, to expose the electrical connection pads 103 and the heat dissipation positions. The heat dissipation position for example is at the electrical connection pad 103, because heat usually is accumulated at the electrical connection pad and is needed to be dissipated. FIG. 3b only shows a case where the heat dissipation position is at the electrical connection pad 103; however, FIG. 3b is merely exemplary, and the heat dissipation position may be at a position other than the electrical connection pad 103 where the heat dissipation is required.

Preferably, the protective layer openings 109 correspond to the electrical connection pads 103 and/or the heat dissipation positions on the wafer active surface 1001 in a one-to-one manner.

Optionally, each protective layer opening 109 of at least a part of the protective layer openings 109 corresponds to a plurality of electrical connection pads 103 and/or heat dissipation positions.

Optionally, at least a part of the electrical connection pads 103 and/or the heat dissipation positions correspond to a plurality of protective layer openings 109.

Optionally, the conductive material is filled in the protective layer opening 109 to form the conductive filled via 124, and the step for example is performed after the molding process.

The step of forming the protective layer opening for example is performed after the molding process.

FIG. 4a to FIG. 4c for example are referred to as another optional process of applying the protective layer 107 on the wafer active surface 1001.

As shown in FIG. 4a, the wafer conductive layer 130 is formed on the wafer active surface 1001. The wafer conductive layer 130 is the wafer conductive trace 106 in FIG. 4a.

At least a part of the wafer conductive traces 106 are connected with at least a part of the electrical connection pads 103 provided on the wafer active surface 1001.

Optionally, the wafer conductive trace 106 interconnects and leads out a plurality of electrical connection pads 103 of at least a part of the electrical connection pads 103 provided on the wafer active surfaces 1001.

Optionally, the wafer conductive traces 106 respectively lead out at least a part of the electrical connection pads 103 provided on the wafer active surface 1001.

Although not shown in the drawing, it should be understood that, a part of the wafer conductive traces 106 respectively lead out a part of the electrical connection pads 103 provided on the wafer active surface 1001, and each of a part of the wafer conductive traces 106 interconnects and leads out a part of the electrical connection pads 103 provided on the wafer active surface 1001.

At least a part of the wafer conductive traces 106 correspond to at least a part of the heat dissipation positions on the wafer active surface 1001.

FIG. 4a only shows a case where the heat dissipation position is at the electrical connection pad 103; however, FIG. 4a is merely exemplary, and the heat dissipation position may be at a position other than the electrical connection pad 103 where the heat dissipation is required.

As shown in FIG. 4b, the protective layer 107 is applied to the wafer active surface 1001 and the wafer conductive trace 106.

As shown in FIG. 4c, the protective layer opening 109 is formed on the surface of the protective layer 107.

Positions of at least a part of the protective layer openings 109 correspond to the wafer conductive trace 106; and the wafer conductive trace 106 is exposed through the protective layer opening 109.

Optionally, the conductive material is filled in the protective layer opening 109 to form the conductive filled via 124, and the step for example is performed after the molding process.

The step of forming the protective layer opening for example is performed after the molding process.

FIG. 5a to FIG. 5c for example are referred to as still another optional process step of applying the protective layer 107 on the wafer active surface 1001.

The wafer conductive layer 130 is formed on the wafer active surface 1001, and the wafer conductive layer 130 is the wafer conductive trace 106 and/or the wafer conductive stud 111.

As shown in FIG. 5a, the wafer conductive trace 106 is formed on the wafer active surface 1001.

At least a part of the wafer conductive traces 106 are connected with at least a part of the electrical connection pads 103 provided on the wafer active surface 1001.

Optionally, the wafer conductive trace 106 interconnect and lead out a plurality of electrical connection pads 103 of at least a part of the electrical connection pads 103 provided on the wafer active surfaces 1001.

Optionally, the wafer conductive traces 106 respectively lead out at least a part of the electrical connection pads 103 provided on the wafer active surface 1001.

Although not shown in the drawing, it should be understood that, a part of the wafer conductive traces 106 respectively lead out a part of the electrical connection pads 103 provided on the wafer active surface 1001, and each of a part of the wafer conductive traces 106 interconnects and leads out a part of the electrical connection pads 103 provided on the wafer active surface 1001.

At least a part of the wafer conductive traces 106 correspond to at least a part of the heat dissipation positions provided on the wafer active surface 1001.

FIG. 5a only shows a case where the heat dissipation position is at the electrical connection pad 103, but FIG. 5a is merely exemplary.

As shown in FIG. 5b, the wafer conductive stud 111 is formed on the pad or the connection point of the wafer conductive trace 106.

As shown in FIG. 5c, the protective layer 107 is applied to the wafer conductive layer 130.

Formation methods and materials of the conductive layer and the protective layer, the shape and the formation method of the protective layer opening in the protective layer forming step according to Embodiment 2 are the same as those according to Embodiment 1, and no details will be repeated here.

The wafer 100 applied with the protective layer by using the above-described method is cut to form the die 113.

Figure 17:
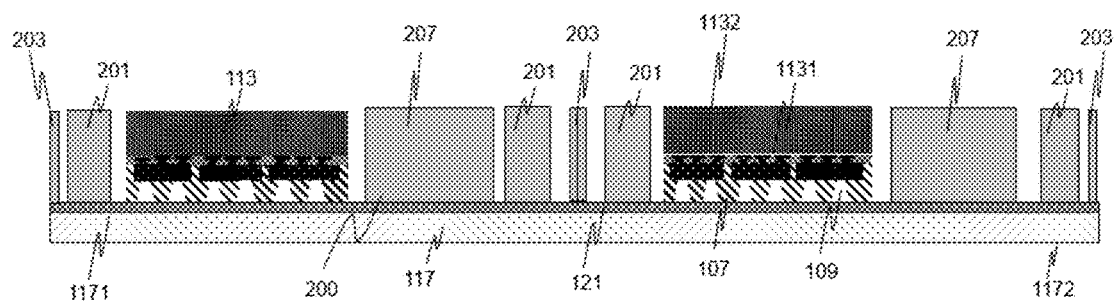
Figure 17:
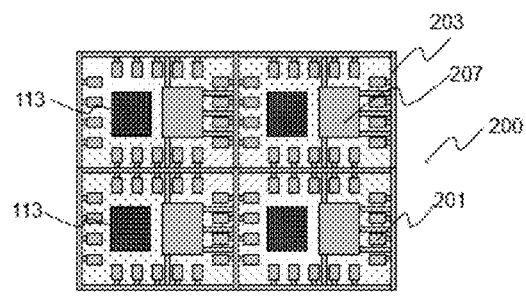

FIG. 17 shows that the die 113 and the metal frame 200 are arranged on the carrier 117, and arrangement steps are similar to the method as described in Embodiment 1. The connection bar 203 of the metal frame 200 in FIG. 17 is cut to separate the metal frame 200 into a plurality of portions but the connection bar 203 of the metal frame 200 is not removed; optionally, the connection bar 203 may be removed from the metal frame 200. The die 113 shown in FIG. 17 is the die 113 including the wafer conductive layer 130 and the protective layer opening 109 in FIG. 6b. However, FIG. 17 is merely exemplary, and the die 113 arranged on the carrier 117 may be the die shown in FIG. 6a or shown in FIG. 6c.

Figure 18:
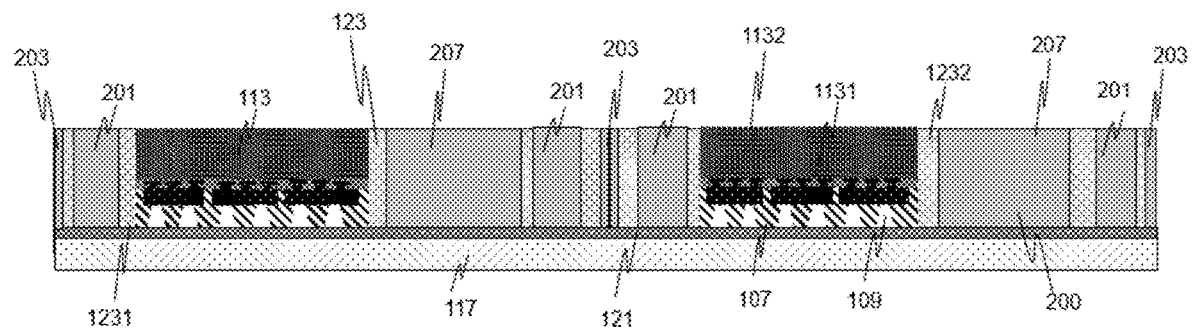

FIG. 18 shows that the molding layer 123 is formed on the carrier 117 to encapsulate all of the die 113 and the metal frame 200, so as to reconstruct the flat-plate structure, then the molding layer 123 is thinned to expose the metal frame 200, thereafter, the carrier 117 is peeled off to form the panel assembly 150, and the method and steps thereof are also similar to those described in Embodiment 1.

Figure 19:
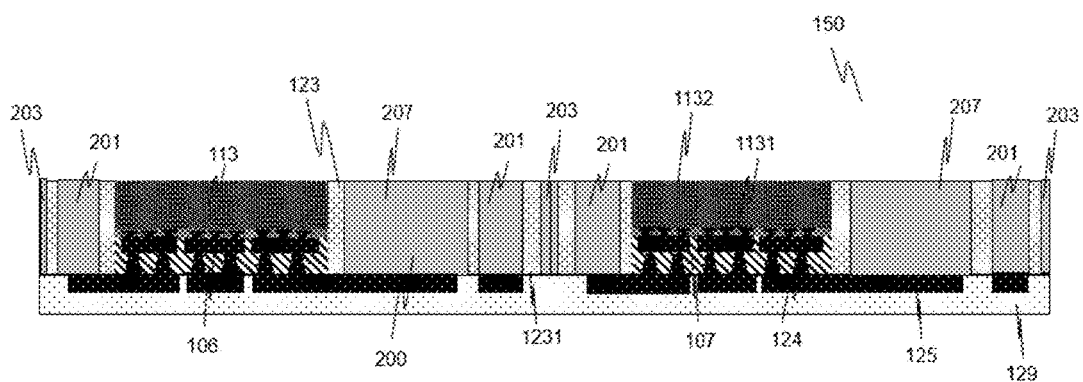

FIG. 19 shows that the panel-level conductive layer and the dielectric layer 129 are formed.

The panel-level conductive layer is formed on a surface of the protective layer 107; in FIG. 19, the panel-level conductive layer is the panel-level conductive trace 125; because the conductive filled via 124 has not been formed as shown in FIG. 18, it is necessary to fill the protective layer opening 109 with the conductive filler material to form the conductive filled via 124 connected with the wafer conductive trace 106; and optionally, the conductive filled via 124 and the panel-level conductive trace 125 are formed in a same step for forming conductive layer.

At least a part of the panel-level conductive traces 125 are connected with at least a part of the wafer conductive traces 106 through the conductive filled vias 124 so as to be connected with the electrical connection pads 1131 provided on the die active surface 1131, and further are connected with the connection pads 201 in the metal units; and the electrical connection pad 103 provided on the die active surface is connected with the connection pad 201 through the panel-level conductive trace 125, the conductive filled via 124 and the wafer conductive layer 130.

At least a part of the panel-level conductive traces 125 are connected with at least a part of the wafer conductive traces 106 through the conductive filled vias 124 so as to be connected with the heat dissipation positions 1131 provided on the die active surface 1131, and further are connected with the heat dissipation pads 207 in the metal units; because the metal conductive material is also a good conductor of heat, heat is capable of being transferred to the heat dissipation pad 207 through the wafer conductive layer 130, the conductive filled via 124 and the panel-level conductive layer, and then is discharged to the outside through the heat dissipation pad 207. Of course, it should be understood that, only a thermally conductive material is provided at the heat dissipation position, to transfer the heat to the heat dissipation pad 207 through the thermally conductive material.

A pattern of the panel-level conductive trace 125 in FIG. 19 is merely exemplary, and the pattern of the panel-level conductive trace 125 may be designed according to specific circuit design.

In the case that the conductive filled via 124 has been formed in the preceding step of applying the protective layer, the step of forming the panel-level conductive layer may be directly performed.

In the case that the protective layer opening 109 has not been formed in the preceding step of applying the protective layer, it is necessary to include a step of forming the protective layer opening 109.

Next, the dielectric layer 129 is formed on the panel-level conductive layer.

Each of the panel-level conductive layer and the dielectric layer 129 for example comprises one layer or a plurality of layers.

Materials and formation methods of the panel-level conductive layer and the dielectric layer 129 are similar to those according to Embodiment 1.

FIG. 19 shows that the die 113 shown in FIG. 6b is packaged in the step of forming the panel-level conductive layer and the dielectric layer 129. It should be understood that, the packaging may be performed on the die shown in FIG. 6a. The protective layer opening 109 is filled with the conductive material to form the conductive filled via 124 connected with the electrical connection pad 103 and/or the heat dissipation position; the panel-level conductive trace 125 is formed on the surface of the protective layer 107; at least a part of the panel-level conductive traces 125 are connected with the conductive filled vias 124 corresponding to the electrical connection pads 103, and are further connected with at least a part of the connection pads 201 of the metal frame 200; the electrical connection pad 103 provided on the die active surface 1131 is led to the connection pad 201 of the metal frame 200 through the conductive filled via 124 and the panel-level conductive trace 125, to implement electrical connection of the electrical connection pad 103 with the external circuit through the connection pad 201. At least a part of the panel-level conductive traces 125 are connected with at least one of the conductive filled vias 124 corresponding to the heat dissipation positions, and are further connected with at least a part of heat dissipation pads 207 of the metal frame 200 to dissipate heat to the outside through the heat dissipation pads 207; and the heat dissipation positions for example are positions of the electrical connection pads 103, or positions other than the electrical connection pads 103. It should be understood that, the packaging may also be performed on the die shown in FIG. 6c.

Figure 20:
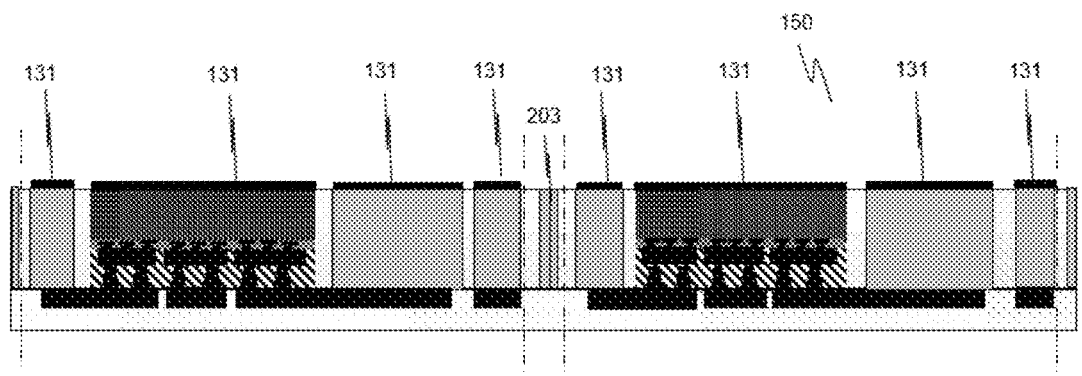

As shown in FIG. 20, the package single body is separated out by cutting to form the packaged chip, and the cutting for example is performed by employing machinery or laser.

The metal frame 200 in FIG. 20 includes the connection bar 203; during the cutting and separating process, it is necessary to perform cutting on the connection bar 203 to remove the connection bar 203, so that the connection bar is not included in the packaged chip 500 after the packaging is completed, and the metal features in the metal unit of the metal frame 200 are independent from each other.

Preferably, before or after the cutting and separating process, the surface treatment layer 131 is formed on the die back surface 1132 and/or the exposed metal frame surface optionally by electroplating, electrodeless electroplating, or other suitable method; for example, the surface treatment layer 131 is formed by electroless nickel electroless palladium immersion gold (ENEPIG) or tin plating (Tin).

Optionally, the surface treatment layer 131 is further configured to implement back grounding of the chip 500, that is, the surface treatment layer 131, according to specific design of the circuit, electrically connects the die back surface 1132 to the special connection pad 201 for implementing back grounding (the special connection pad for implementing back grounding is: the connection pad that is connected with the electrical connection pad having its back surface grounded and provided on the die active surface through the conductive structure).

As compared with Embodiment 1, because the heat dissipation pad 207 of the heat dissipation structure is added in Embodiment 2, heat generated during using of the chip is dissipated in time by means of the heat dissipation pad 207.

In the present disclosure, Embodiment 3 mainly differs from Embodiment 1 in the structure of the metal frame 200, other identical parts will not be repeated, and only parts different from Embodiment 1 will be described in this embodiment.

The step of forming the protective layer 107 is similar to that according to Embodiment 1, and no details will be repeated here.

Figure 21:
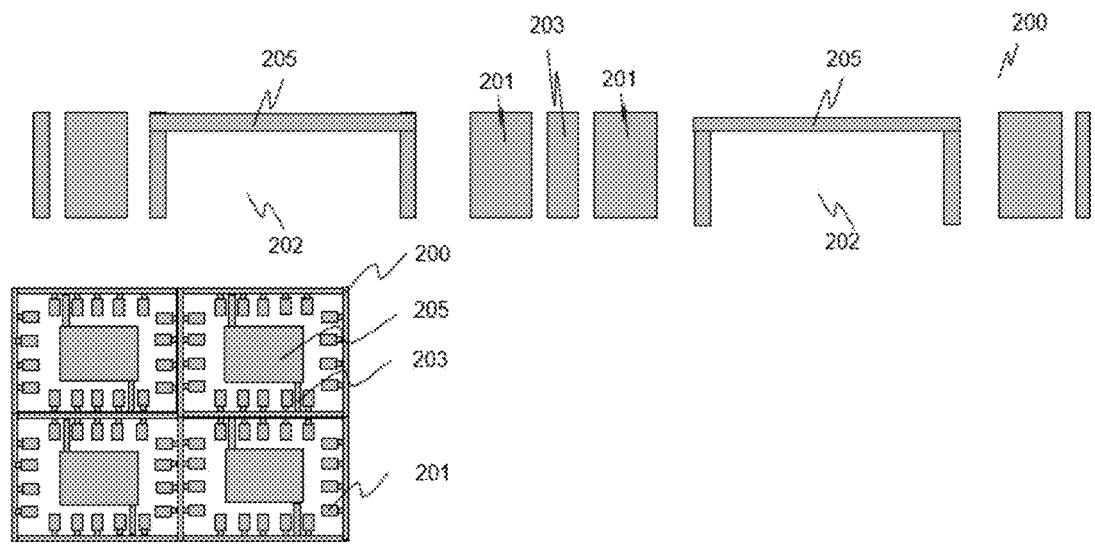
FIG. 21 to FIG. 25 are schematic diagrams of the chip packaging method according to still another exemplary embodiment of the present disclosure.

FIG. 21 shows a structural diagram of the metal frame 200 according to Embodiment 3 of the present disclosure. On a basis that the metal feature of the metal frame 200 is the connection pad 201 according to Embodiment 1, the metal feature of the metal frame 200 in Embodiment 3 further includes a heat dissipation structure for dissipating heat, and the heat dissipation structure is a back surface heat sink 205 in FIG. 21. Although not shown in the drawing, optionally, the heat dissipation structure for example comprises both of the back surface heat sink and the heat dissipation pad. As shown in FIG. 21, the back surface heat sink 205 and the metal frame 200 are connected into a whole by the connection bar 203, to ensure that the back surface heat sink 205 and the metal frame 200 are connected together during transferring the metal frame 200. The back surface heat sink 205 is formed by half etching (or stamping) a metal sheet; or it may be understood that, a portion of the metal sheet is thinned from a lower surface of the metal sheet, so that an upper surface of the metal sheet is reserved as the back surface heat sink 205 after the etching (or stamping) process and the lower surface of the metal sheet is removed to form the blank region, which is the vacancy 202 for placing the die 113. The connection bar 203 that connects the back surface heat sink 205 and the metal frame 200 together are not subjected to the half etching (or stamping) process, so a thickness of the connection bar 203 is equal to a thickness of the metal sheet, and the connection bar 203 not only connects the back surface heat sink 205 and the metal frame 200 together, but also plays a role in supporting the back surface heat sink 205 after the back surface heat sink 205 is applied to the die back surface 1132 so as to keep the back surface heat sink 205 horizontal and hard to tilt. FIG. 21 shows that the number of connection bars 203 connected with the back surface heat sink 205 is 2; but optionally, the number is 4, that is, four corners of the back surface heat sink 205 are all connected with connection bars 203; or the number is any other number. After the die 113 is accommodated into the vacancy 202, the die back surface 1132 is in contact with the back surface heat sink 205 for heat dissipation.

Figure 22:
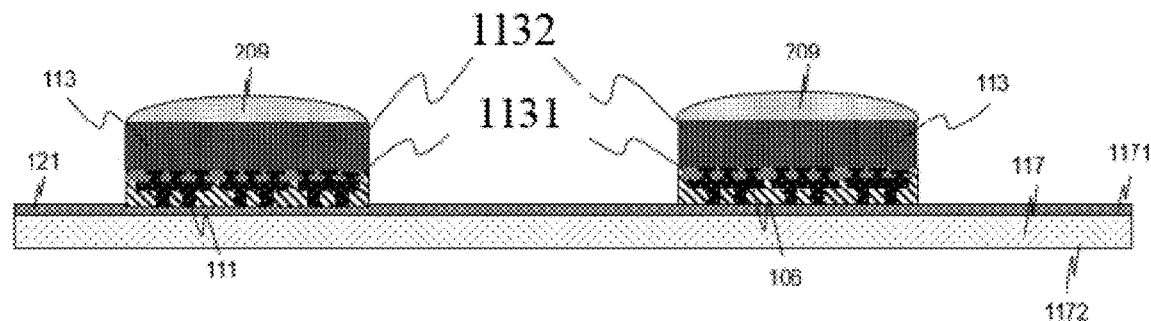

FIG. 22 shows that the die 113 is arranged on the carrier 117, a thermally conductive material 209 is applied to the die back surface 1132, the die 113 is connected with the back surface heat sink through the thermally conductive material 209, and the thermally conductive material 209 is preferably a liquid substance or a paste substance, which reduces interface resistance for heat transferring.

Figure 23:
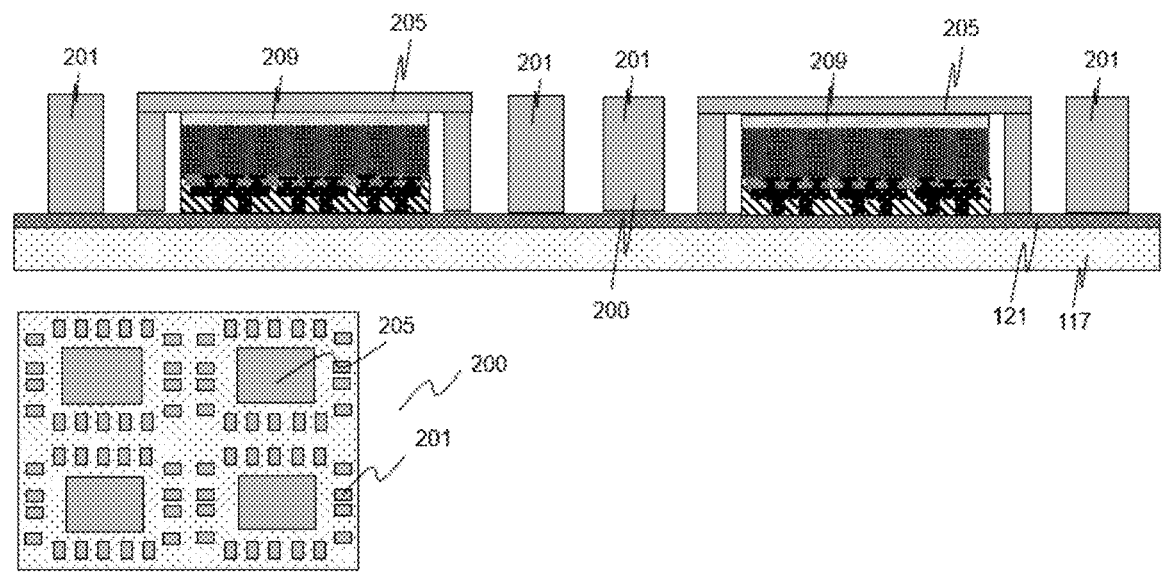

FIG. 23 shows that the metal frame 200 is bonded to the carrier 117, the die back surface 1132 is connected with the back surface heat sink through the thermally conductive material 209, and heat generated during using of the chip that has been packaged is dissipated to the outside through the thermally conductive material 209 and the back surface heat sink 205. The process of applying the metal frame 200 to the carrier 117 for example is the process of transferring by employing the temporary support as described in Embodiment 1.

Figure 24:
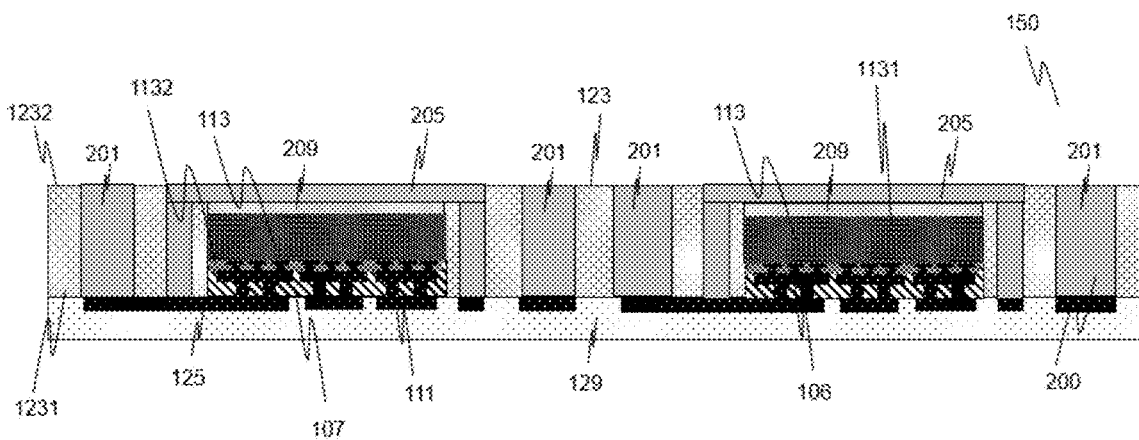

FIG. 24 shows a step of applying the molding layer 123 and a step of forming the panel-level conductive layer and the dielectric layer 129, the steps are similar to those described in Embodiment 1, and no details will be repeated.

Optionally, according to specific design of the circuit, a conductive structure which is embodied as the wafer-level conductive layer and the panel-level conductive layer in FIG. 24, is employed to electrically connect the electrical connection pad having its back surface grounded and provided on the die active surface to the back surface heat sink 205, so as to implement the back grounding by using the back surface heat sink 205.

Figure 25:
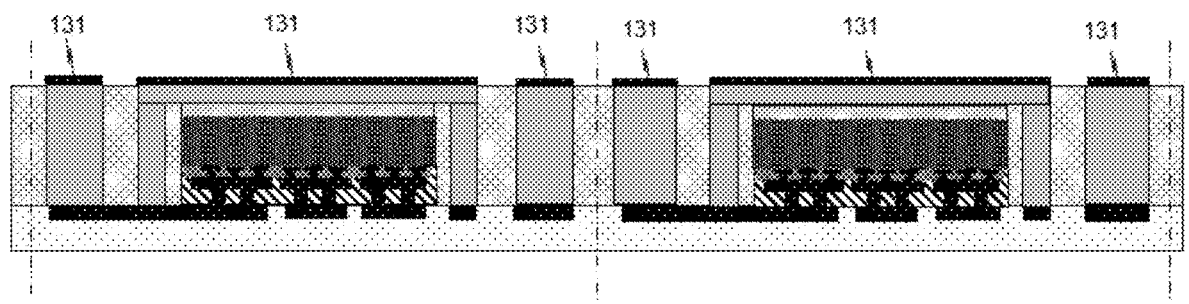

FIG. 25 shows that the package single body is separated out by cutting to form the packaged chip.

Preferably, before or after the step of cutting and separating, the surface treatment layer 131 is formed on the die back surface 1132 and/or the exposed metal frame surface optionally by electroplating, electrodeless electroplating, or other suitable method, for example, electroless nickel electroless palladium immersion gold (ENEPIG), or tin plating (Tin).

In the case that the conductive structure is not employed to implement the back grounding of the chip, the surface treatment layer 131 is optionally configured to implement the back grounding of the chip 500, that is, the surface treatment layer 131, according to specific design of the circuit, electrically connects the back surface heat sink 205 to the special connection pad 201 for implementing back grounding (the special connection pad for implementing back grounding is: the connection pad that is connected with the electrical connection pad having its back surface grounded and provided on the die active surface through the conductive structure). At this time, the thermally conductive material 209 through which the back surface heat sink 205 is applied to the die back surface is an electrically conductive material such as a metal thermally conductive paste.

In the present disclosure, Embodiment 4 mainly differs from Embodiment 1 in that a metal layer is formed on the wafer back surface before the molding step, other identical parts will not be repeated, and only parts different from Embodiment 1 will be described in this embodiment.

Figure 26:
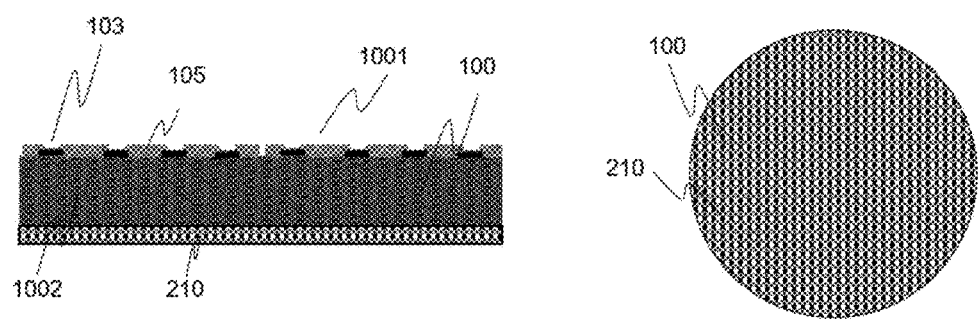
FIG. 26 to FIG. 28 are schematic diagrams of the chip packaging method according to yet another exemplary embodiment of the present disclosure.

FIG. 26 shows that the metal layer 210 is formed on the wafer back surface 1002 of the wafer 100 according to Embodiment 4 of the present disclosure, and the metal layer 210 optionally is formed of one or more layers of aluminum, tin, nickel, gold, silver, lead, bismuth, copper or a combination thereof (preferably copper) by electroplating, electrodeless electroplating, sputtering or other suitable mode.

The protective layer is formed on the wafer active surface 1001 of the wafer 100, the step of forming the protective layer 107 is similar to that according to Embodiment 1, and no details will be repeated here. The wafer 100 formed with the metal layer 210 and the protective layer 107 is cut and separated into the dies 113 having the metal layer 210 and the protective layer 107.

Optionally, the step of forming the metal layer 210 is performed after the step of forming the protective layer 107 or after the step of cutting and separating.

Next, the die 113 and the metal frame 200 are arranged on the carrier 117, and the molding layer 123 is formed on the carrier 117.

Figure 27:
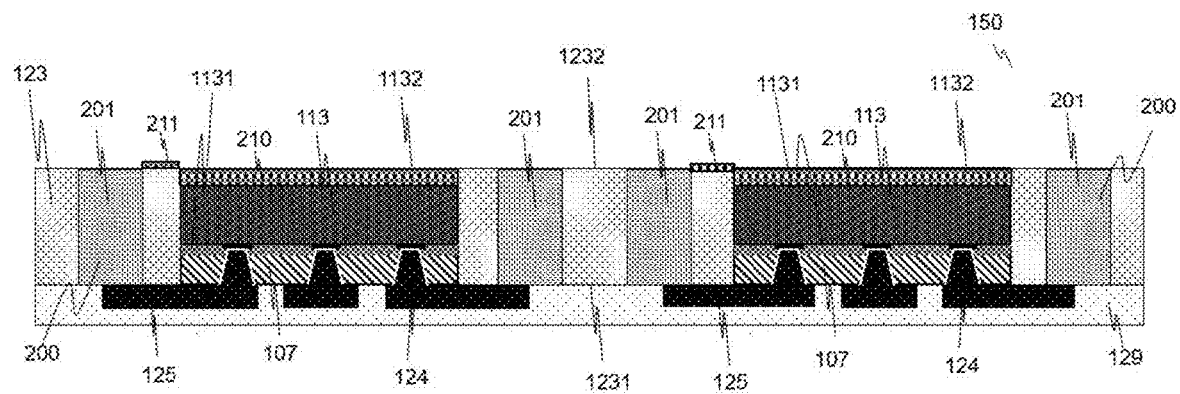

FIG. 27 shows the step of forming the molding layer 123 for packaging the die 113 and the metal frame 200 on the carrier 117 and the step of forming the panel-level conductive layer and the dielectric layer 129, the steps are similar to those as described in Embodiment 1, and no details will be repeated here. FIG. 27 is merely an exemplary drawing, and only shows that the die 113 is in a form of the die having the protective layer 107 and the protective layer opening as shown in FIG. 6a; the die 113 may be in a form of the die having the wafer conductive layer 130 and the protective layer 107 as well as the protective layer opening 109 as shown in FIG. 6b, or may be in a form of the die having the wafer conductive layer 130 and the protective layer 107 as shown in FIG. 6c. Meanwhile, the metal frame 200 may be the metal frame 200 having the heat dissipation pad 207. A metal layer surface of the die back surface 1132 and a metal feature back surface are exposed from the molding layer back surface by thinning the molding layer.

Preferably, according to design, the metal layer of the die back surface 1132 is electrically connected with at least one metal feature through a conductive material, and the conductive material is optionally a conductive paste 211. In this case, the metal layer of the die back surface 1132 and the entire metal frame are in an electrically connected state. In a next step, during the surface treatment layer is formed by electroplating, the metal layer and the metal frame form an electrical connection path for conducting current, so that the surface treatment layer is formed on the metal layer surface and the metal frame back surface without providing a seed layer. In this case, the connection bar 203 should be reserved in the metal frame.

In some embodiments, the conductive paste 211 is further configured to implement the back grounding of the chip 500, that is, the conductive paste 211, according to specific design of the circuit, electrically connects the metal layer 210 of the die back surface to the special connection pad 201 for implementing back grounding (the special connection pad for implementing back grounding is: the connection pad that is connected with the electrical connection pad having its back surface grounded and provided on the die active surface through the conductive structure).

Figure 28:
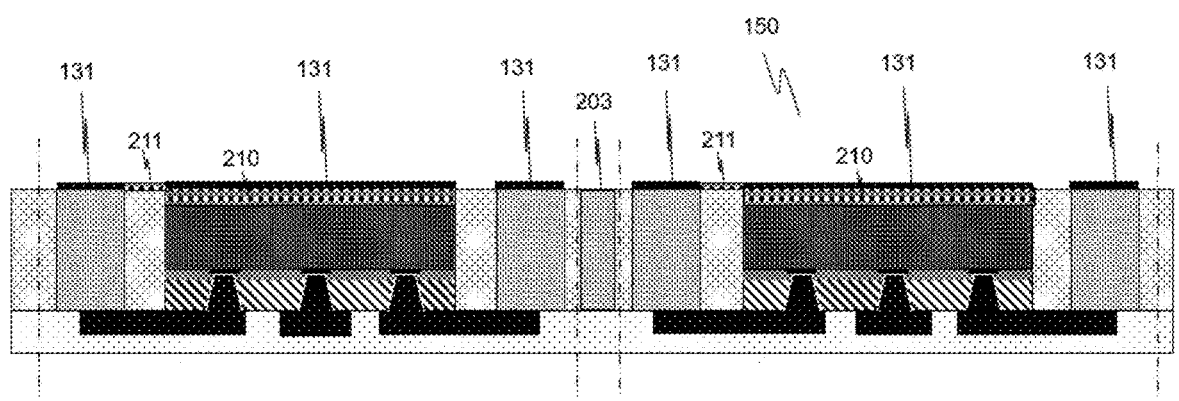

As shown in FIG. 28, the package single body is separated out by cutting to form the packaged chip.

Preferably, before or after the step of cutting and separating, the surface treatment layer 131 is formed on the die back surface 1132 and/or the exposed metal frame surface optionally by electroplating, electrodeless electroplating or other suitable method, for example, electroless nickel electroless palladium immersion gold (ENEPIG) or tin plating (Tin). In the case that the surface treatment layer 131 is formed by electroplating, the metal layer of the die back surface and the metal frame are electrically connected together due to the presence of the conductive paste 211 to form a whole structure for conducting a plating current during plating, so the plating step is directly performed without forming the seed layer.

As compared with Embodiment 1, the metal layer 210 is added on the back surface of the die 113 in Embodiment 4, the metal layer enhances heat dissipation so that heat generated during the using of the chip is dissipated in time; moreover, the step of forming the surface treatment layer 131 becomes simpler by using the metal layer in combination with the conductive paste 211.

Chip package structures may also be provided in the embodiment of the present disclosure. For example, the chip package structures formed using the packaging method described in the above embodiments. Therefore, all the description in the embodiments of the above packaging method are applicable to the chip package structures.

FIG. 29*a*, FIG. 29*b*, FIG. 29*c*, FIG. 29*d* and FIG. 29*e* are schematic diagrams of chip structures obtained by using the above-described packaging methods according to the exemplary embodiments of the present disclosure. As shown in the drawings, the chip 500 comprises: at least one die 113; the protective layer 107; the metal unit, the metal unit including at least one metal feature; the molding layer 123, for encapsulating the die 113 and the metal unit; and the chip structure is connected with the external circuit through at least one metal feature.

In some embodiments, the chip 500 further comprises a conductive structure; and at least one metal feature of the metal unit is connected with the die 113 through the conductive structure. In some embodiments, the metal feature includes the connection structure and/or the heat dissipation structure.

Figure 29A:
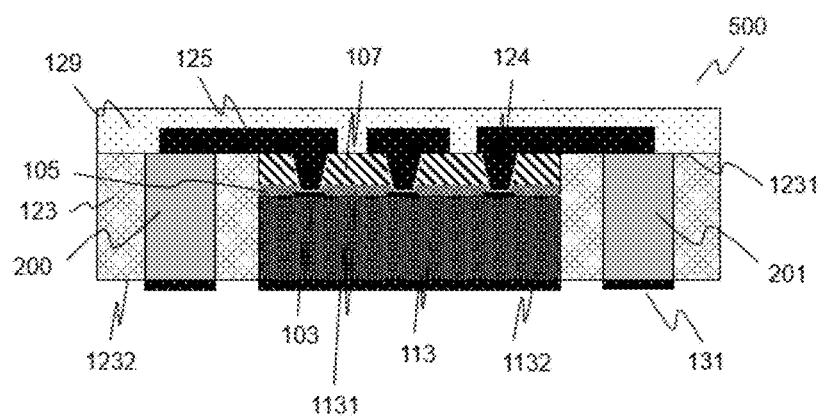
FIG. 29a, FIG. 29b, FIG. 29c, FIG. 29d and FIG. 29e are schematic diagrams of chip structures obtained by using the above-described packaging methods according to the exemplary embodiments of the present disclosure.

Specifically, as shown in FIG. 29*a*, the metal feature is the connection structure, the connection structure is embodied as the connection pad 201, and the chip 500 is connected with the external circuit through at least one connection pad 201.

As shown in FIG. 29*a*, the conductive structure includes the conductive filled via 124 and the panel-level conductive layer which is embodied as the panel-level conductive trace 125 in the drawing; the panel-level conductive layer for example is the panel-level conductive trace 125 and the panel-level conductive stud; the panel-level conductive layer for example has one layer as shown in the drawing or has a plurality of layers; the conductive filled via 124 is formed by filling the protective layer opening with the conductive material; at least one of the conductive filled vias 124 are connected with the electrical connection pads 103; the panel-level conductive layer is formed on the surface of the protective layer 107 and the molding layer front surface 1231; at least a portion of the panel-level conductive layer is connected with the conductive filled via 124 and connected with the connection pad 201; and the surface of the protective layer 107, the molding layer front surface 1231, and a front surface of the connection pad 201 are flush with one another.

In some embodiments, the conductive filled via 124 has the lower surface and the upper surface, and the area ratio of the lower surface of the conductive filled via to the upper surface of the conductive filled via is 60% to 90%.

In some embodiments, the gap is between the lower surface of the conductive filled via and the insulating layer 105; and preferably, the lower surface of the conductive filled via is at the position close to the central portion of the electrical connection pad 103.

In some embodiments, the conductive cover layer is provided on the electrical connection pad 103.

FIG. 29*a* is merely exemplary, the conductive structure for example includes the wafer conductive layer 130, the conductive filled via 124 and the panel-level conductive layer; or the conductive structure for example includes the wafer conductive layer 130 and the panel-level conductive layer.

The die back surface 1132 and the metal unit back surface which is specifically the connection pad back surface are exposed from the molding layer back surface 1232, and a portion exposed from the molding layer back surface 1232 is provided with the surface treatment layer 131. Optionally, the surface treatment layer 131 is further configured to implement the back grounding of the chip 500, that is, the surface treatment layer 131, according to specific design of the circuit, electrically connects the die back surface 1132 to the special connection pad 201 for implementing back grounding (the special connection pad for implementing back grounding is: the connection pad that is connected with the electrical connection pad having its back surface grounded and provided on the die active surface through the conductive structure).

It should be noted that, for the materials, structures or technical effects, etc. which are not mentioned in the descriptions of the package structures, reference may be made to the embodiments of the above packaging methods, and the details are not described herein again.

The chip 500 further comprises the dielectric layer 129 that encapsulates the panel-level conductive layer, and the outermost dielectric layer 129 completely encapsulates the panel-level conductive layer.

Figure 29B:
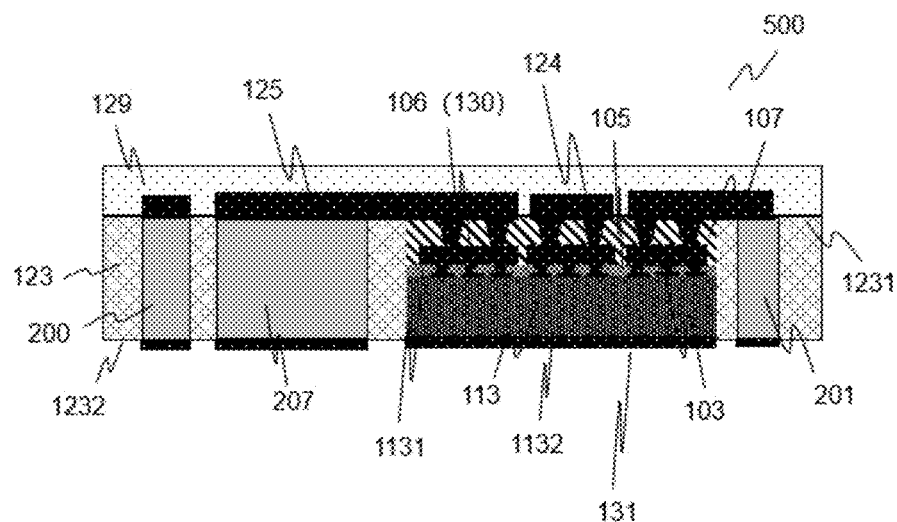

As shown in FIG. 29*b*, the metal feature is the connection structure and the heat dissipation structure, the connection structure is embodied as the connection pad 201, the chip 500 is connected with the external circuit through at least one connection pad 201; and the heat dissipation structure is embodied as the heat dissipation pad 207.

As shown in FIG. 29b, the conductive structure includes the wafer conductive layer 130 which is embodied as the wafer conductive trace 106 in the drawing, the conductive filled via 124 and the panel-level conductive layer; the panel-level conductive layer is embodied as the panel-level conductive trace 125 in the drawing; the panel-level conductive layer for example is the panel-level conductive trace 125 and the panel-level conductive stud; the panel-level conductive layer for example has one layer as shown in the drawing or has a plurality of layers; at least a part of the wafer conductive layer 130 is connected with the electrical connection pad 103 and/or the heat dissipation position; the conductive filled via 124 is formed by filling the protective layer opening with the conductive material; at least one of the conductive filled vias 124 are connected with the wafer conductive layer; the panel-level conductive layer is formed on the surface of the protective layer 107 and the molding layer front surface 1231; at least a portion of the panel-level conductive layer is connected with the conductive filled via 124 and connected with the metal unit; and the surface of the protective layer 107, the molding layer front surface 1231, and the metal unit front surface are flush with one another.

In some embodiments, at least a part of the wafer conductive layer 130 interconnects and leads out a plurality of electrical connection pads 103; and in other embodiments, at least a part of the wafer conductive layer 130 respectively leads out the electrical connection pads 103.

Optionally, the contact area of the single contact region between the wafer conductive layer 130 and the electrical connection pads 103 is smaller than the contact area of the single contact region between the wafer conductive layer 130 and the conductive filled vias 124.

The conductive filled via has the lower surface and the upper surface; and optionally, the area of the lower surface of the conductive filled via is smaller than the area of the upper surface of the conductive filled via.

FIG. 29b is merely exemplary, the conductive structure for example includes the conductive filled via 124 and the panel-level conductive layer; or the conductive structure for example includes the wafer conductive layer 130 and the panel-level conductive layer.

The die back surface 1132 and the metal unit back surface which is specifically the connection pad back surface and the heat dissipation pad back surface are exposed from the molding layer back surface 1232, and a portion exposed from the molding layer back surface 1232 is provided with the surface treatment layer 131. Optionally, the surface treatment layer 131 is further configured to implement back grounding of the chip 500, that is, the surface treatment layer 131, according to specific design of the circuit, electrically connects the die back surface 1132 to the special connection pad 201 for implementing back grounding (the special connection pad for implementing back grounding is: the connection pad that is connected with the electrical connection pad having its back surface grounded and provided on the die active surface through the conductive structure).

The chip 500 further comprises the dielectric layer 129 that encapsulates the panel-level conductive layer, and the outermost dielectric layer 129 completely encapsulates the panel-level conductive layer.

Figure 29C:
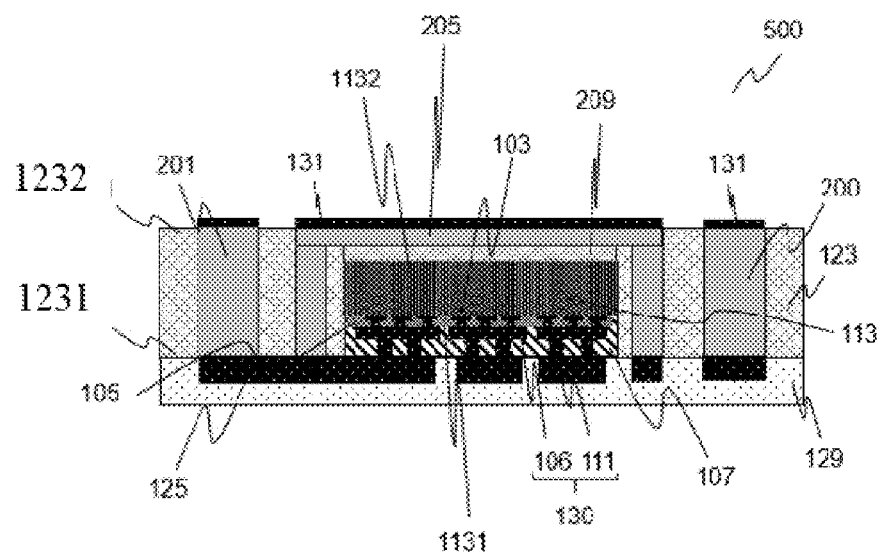

As shown in FIG. 29c, the metal feature is the connection structure and the heat dissipation structure, the connection structure is embodied as the connection pad 201, the heat dissipation structure is embodied as the back surface heat sink 205; and optionally, the back surface heat sink 205 is applied to the die back surface through the thermally conductive material 209. The chip 500 is connected with the external circuit through at least one connection pad 201. In some embodiments, the heat dissipation structure is the heat dissipation pad 207 and the back surface heat sink 205.

As shown in FIG. 29c, the conductive structure includes the wafer conductive layer 130 and the panel-level conductive layer which is embodied as the panel-level conductive trace 125 in the drawing; the panel-level conductive layer for example is the panel-level conductive trace 125 and the panel-level conductive stud; the panel-level conductive layer for example has one layer as shown in the drawing or has a plurality of layers; the wafer conductive layer for example includes the wafer conductive trace 106 and the wafer conductive stud 111; at least a part of the wafer conductive traces 106 are connected with the electrical connection pads 103 and/or the heat dissipation position; at least a part of the wafer conductive studs 111 are formed on the wafer conductive traces 106; the panel-level conductive layer is formed on the surface of the protective layer 107 and the molding layer front surface 1231; at least a portion of the panel-level conductive layer is connected with the wafer conductive stud 111 and connected with the metal unit; and the surface of the protective layer 107, the molding layer front surface 1231, and the metal unit front surface are flush with one another.

In some embodiments, at least a part of the wafer conductive traces 106 respectively lead out the electrical connection pads 103; in other embodiments, at least a part of the wafer conductive traces 106 interconnect and lead out a plurality of electrical connection pads 103.

Optionally, the wafer conductive layer is the wafer conductive stud 111, and at least a part of the wafer conductive studs are connected with the electrical connection pads 103 and/or the heat dissipation positions.

FIG. 29c is merely exemplary, the conductive structure for example includes the conductive filled via 124 and the panel-level conductive layer; or the conductive structure for example includes the wafer conductive layer 130, the conductive filled via 124 and the panel-level conductive layer.

Optionally, according to specific design of the circuit, the conductive structure is employed to electrically connect the electrical connection pad having its back surface grounded and provided on the die active surface to the back surface heat sink 205, so as to implement the back grounding by using the back surface heat sink 205.

The die back surface 1132 which is specifically the back surface of the back surface heat sink 205 and the metal unit back surface are exposed from the molding layer back surface 1232, and a portion exposed from the molding layer back surface 1232 is provided with the surface treatment layer 131. In the case that the conductive structure is not employed to implement the back grounding of the chip, the surface treatment layer 131 is optionally configured to implement the back grounding of the chip 500, that is, the surface treatment layer 131, according to specific design of the circuit, electrically connects the back surface heat sink 205 to the special connection pad 201 for implementing back grounding (the special connection pad for implementing back grounding is: the connection pad that is connected with the electrical connection pad having its back surface grounded and provided on the die active surface through the conductive structure). At this time, the thermally conductive material 209 through which the back surface heat sink 205 is applied to the die back surface is the electrically conductive material such as the metal thermally conductive paste.

The chip 500 further comprises the dielectric layer 129 that encapsulates the panel-level conductive layer, and the outermost dielectric layer 129 completely encapsulates the panel-level conductive layer.

According to structures shown in for example FIG. 29*a* and FIG. 29*b*, optionally, the die back surface 1132 further has the metal layer 210, and the surface of the metal layer 210 is exposed from the molding layer back surface 1232. The metal feature has the metal feature back surface, and the metal feature back surface is exposed from the molding layer back surface 1232. Preferably, the surface of the metal layer 201 is connected with at least one metal feature back surface through the conductive paste 211.

In some embodiments, the conductive paste 211 is further configured to implement the back grounding of the chip 500, that is, the conductive paste 211, according to specific design of the circuit, electrically connects the metal layer 210 of the die back surface to the special connection pad 201 for implementing back grounding (the special connection pad for implementing back grounding is: the connection pad that is connected with the electrical connection pad having its back surface grounded and provided on the die active surface through the conductive structure).

Figure 29D:
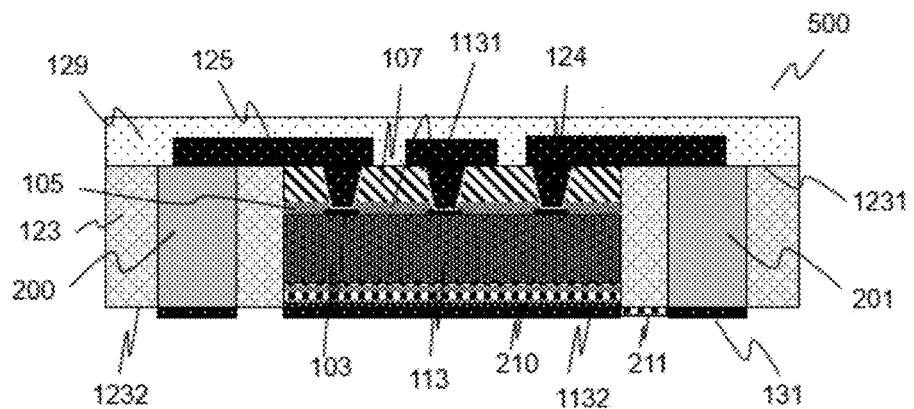
Figure 29E:
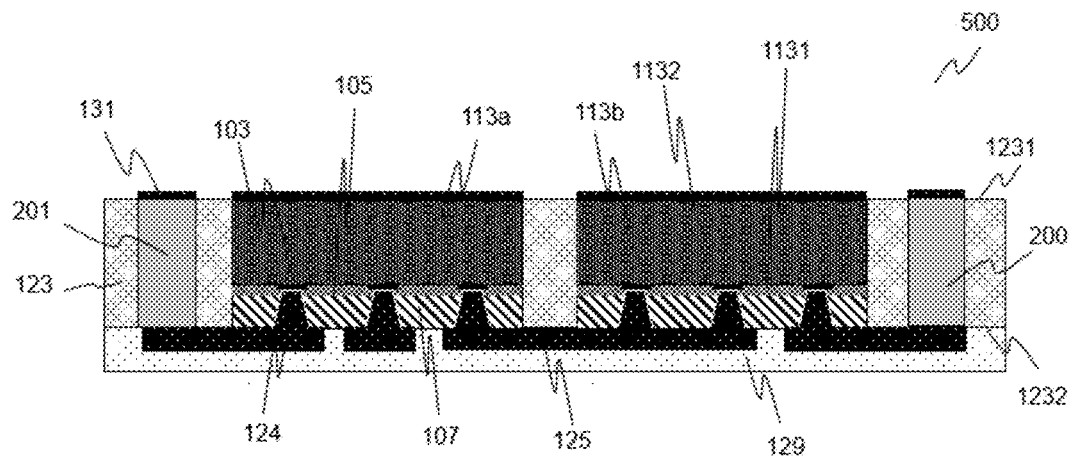

Some embodiments of the package structure having the metal layer 210 and the conductive paste 211 are shown in FIG. 29*d*.

According to structures shown in for example FIG. 29*a*, FIG. 29*b* and FIG. 29*c*, optionally, the chip structure has two or more dies 113; preferably, the two or more dies are two or more dies having different functions; and the two or more dies 113 are electrically connected according to product design. One embodiment of the package structure having the two or more dies 113 is shown in FIG. 29*e*.

In the chip structure, preferably, the protective layer 107 has the Young's modulus of any numerical range or value below: 1,000 MPa to 20,000 MPa, 1,000 MPa to 10,000 MPa, 4,000 MPa to 8,000 MPa, 1,000 MPa to 7,000 MPa, 4,000 MPa to 7,000 MPa and 5,500 MPa.

The protective layer 107 is soft and has good flexibility and elasticity, so that the protective layer 107 provides sufficient support for the conductive layer formed on its surface, and is especially applicable to the package of the thin die with a large electric flux.

In some embodiments, the protective layer 107 is made of an organic/inorganic composite material. Preferably, the organic/inorganic composite material in which the inorganic particles are added to the organic material is employed, so that the material properties of the organic material is modified and thus the organic/inorganic composite material has properties of both the organic material and the inorganic material.

In some embodiments, the protective layer 107 has the thickness of any numerical range or value below: 15 µm to 50 µm, 20 µm to 50 µm, 35 µm, 45 µm and 50 µm. The thickness range ensures that the protective layer 107 provides sufficient buffering and support.

In some embodiments, the protective layer 107 has the coefficient of thermal expansion of any numerical range or value below: 3 ppm/K to 10 ppm/K, 5 ppm/K, 7 ppm/K and 10 ppm/K.

In some embodiments, the molding layer 123 has the coefficient of thermal expansion of any numerical range or value below: 3 ppm/K to 10 ppm/K, 5 ppm/K, 7 ppm/K and 10 ppm/K.

In some embodiments, the molding layer 123 and the protective layer 107 have a same or similar coefficient of thermal expansion, so that accumulation of interface fatigue at interfaces between the protective layer 107, the molding layer 123 and the die 113 is avoided, the packaged chip becomes durable, and the service life of the chip is prolonged.

Figure 30:
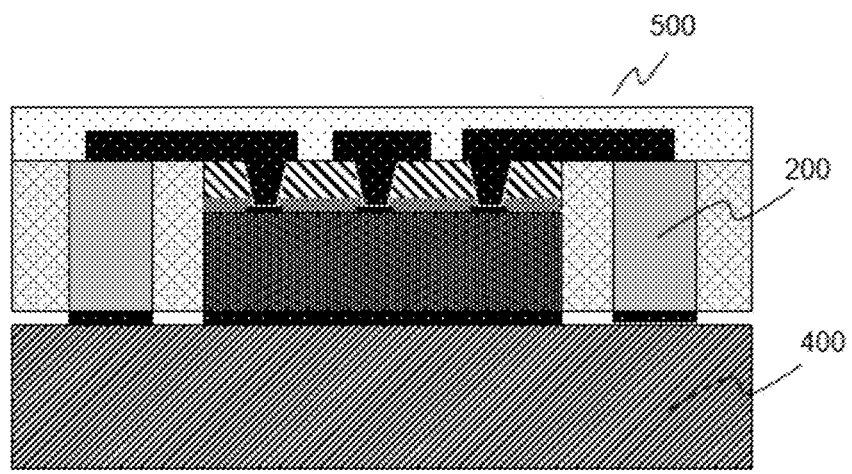
FIG. 30 is a schematic diagram of a packaged chip in use according to an exemplary embodiment of the present disclosure.

FIG. 30 is an exemplary schematic diagram of the chip 500 in use; during the chip 500 is used, at least one metal feature which is embodied as the connection pad 201 in the drawing is employed to connect the chip 500 to a circuit board or a substrate 400.

The following examples pertain to various embodiments.

According to some embodiments, the chip structure according to the present disclosure replaces a wire bonding structure. As compared with the wire bonding package structure, the present disclosure has a simpler packaging process, avoids mutual interference of signals between wires in the wire bonding structure, and avoids noises generated by vibration of the wires in the case that the chip is in operation. In addition, the connection structure is employed to replace a wire structure, so that the present disclosure is more applicable to the package of the chip with the large electric flux.

At least one embodiment in the present disclosure relates to a chip structure, comprising: at least one die; a protective layer; a metal unit, the metal unit including at least one metal feature; and a molding layer, encapsulating the at least one die and the metal unit, wherein the chip structure is connected with an external circuit through the at least one metal feature.

According to some embodiments, the chip structure further comprises a conductive structure, and the at least one metal feature of the metal unit is connected with the at least one die through the conductive structure.

According to some embodiments, the conductive structure includes conductive filled vias and a panel-level conductive layer; the conductive filled vias are provided by filling protective layer openings with a conductive material, and the protective layer openings are provided in the protective layer; at least one of the conductive filled vias are connected with electrical connection pads and/or heat dissipation positions provided on the at least one die; the panel-level conductive layer is provided on a surface of the protective layer and a molding layer front surface of the molding layer; at least a portion of the panel-level conductive layer is connected with the conductive filled vias and is connected with the metal unit; and the surface of the protective layer, the molding layer front surface, and a metal unit front surface of the metal unit are flush with one another.

According to some embodiments, the at least one metal feature includes a connection structure and/or a heat dissipation structure, the connection structure includes a connection pad, and the heat dissipation structure includes a heat dissipation pad.

According to some embodiments, the heat dissipation structure further includes a back surface heat sink, and the back surface heat sink is applied to a die back surface of the at least one die through a thermally conductive material.

According to some embodiments, a die back surface of the at least one die is applied with a metal layer, and a surface of the metal layer is exposed from a molding layer back surface of the molding layer.

According to some embodiments, the at least one metal feature has a metal feature back surface, the metal feature back surface is exposed from the molding layer back surface, and the surface of the metal layer is connected with the metal feature back surface through a conductive paste.

According to some embodiments, a die back surface of the at least one die and a metal unit back surface of the metal unit are exposed from a molding layer back surface of the molding layer, and such portion exposed from the molding layer back surface is provided with a surface treatment layer.

According to some embodiments, the at least one die comprises two or more dies, the plurality of dies are dies having different functions, and the plurality of dies are electrically connected according to product design.

According to some embodiments, the chip structure further comprises a dielectric layer that encapsulates the panel-level conductive layer, and an outermost dielectric layer completely encapsulates the panel-level conductive layer.

According to some embodiments, each filled via has a lower surface and an upper surface, and an area ratio of the lower surface of the filled via to the upper surface of the filled via is 60% to 90%.

According to some embodiments, a gap is between the lower surface of the filled via and an insulating layer provided on the die active surface.

According to some embodiments, the lower surface of the filled via is located at a position close to a central portion of one of the connection pads.

According to some embodiments, a conductive cover layer is provided on the connection pads.

At least one embodiment in the present disclosure relates to a chip packaging method, comprising: providing a wafer, and forming a protective layer on a wafer active surface of the wafer; cutting and separating the wafer to form a die; providing a metal structure, the metal structure including at least one metal unit; adhering the die and the metal structure onto a carrier; and forming a molding layer.

According to some embodiments, the chip packaging method further comprises: forming a conductive structure, wherein the die is connected with at least one metal feature of the at least one metal unit through the conductive structure.

According to some embodiments, the forming the conductive structure includes: forming protective layer openings in the protective layer provided on the wafer active surface, wherein at least a part of the protective layer openings are formed at electrical connection pads and/or heat dissipation positions provided on the die; filling a conductive material in the protective layer openings to form conductive filled vias and forming a panel-level conductive layer, wherein the panel-level conductive layer is formed on a surface of the protective layer and a molding layer front surface of the molding layer, at least a portion of the panel-level conductive layer is connected with the conductive filled vias and is connected with the at least one metal unit, and the surface of the protective layer, the molding layer front surface, and a metal unit front surface of the at least one metal unit are flush with one another.

According to some embodiments, the at least one metal feature includes a connection structure and/or a heat dissipation structure, the connection structure includes a connection pad, and the heat dissipation structure includes a heat dissipation pad.

According to some embodiments, the heat dissipation structure further includes a back surface heat sink, and the back surface heat sink is applied to a die back surface of the die through a thermally conductive material.

According to some embodiments, the chip packaging method further comprises: applying a metal layer to a die back surface of the die, and connecting a surface of the metal layer with a metal feature back surface of the at least one metal feature through a conductive paste.

According to some embodiments, the chip packaging method further comprises: forming a dielectric layer that encapsulates the panel-level conductive layer, wherein an outermost dielectric layer completely encapsulates the panel-level conductive layer.

According to some embodiments, the metal structure is a metal frame, and the at least one metal unit comprises a plurality of metal units; the metal frame is transferred to the carrier through a temporary support; and after the metal frame is arranged on the temporary support, the method further comprises: cutting and separating a connection bar of the metal frame so that the metal units in the metal frame are independent of one another.

According to some embodiments, the metal structure is a metal frame, and the at least one metal unit comprises a plurality of metal units; the metal frame is transferred to the carrier through a temporary support; and after the metal frame is arranged on the temporary support, the method further comprises: removing a connection bar from the metal frame so that the metal units in the metal frame are independent of one another.

At least one embodiment in the present disclosure relates to a chip structure, comprising: at least one die; a protective layer; a metal unit, the metal unit including at least one metal feature; a molding layer; and a conductive structure, the conductive structure including a wafer conductive layer, conductive filled vias and a panel-level conductive layer, wherein the at least one metal feature is connected with the at least one die through the conductive structure; and the chip structure is connected with an external circuit through the at least one metal feature.

According to some embodiments, at least a part of the wafer conductive layer is connected with electrical connection pads and/or heat dissipation positions provided on the at least one die; the conductive filled vias are provided by filling protective layer openings with a conductive material, and the protective layer openings are provided in the protective layer; at least one of the conductive filled vias are connected with the wafer conductive layer; the panel-level conductive layer is provided on a surface of the protective layer and a molding layer front surface of the molding layer; at least a portion of the panel-level conductive layer is connected with the conductive filled vias and is connected with the metal unit; and the surface of the protective layer, the molding layer front surface, and a metal unit front surface of the metal unit are flush with one another.

According to some embodiments, at least a part of the wafer conductive layer interconnects and leads out a plurality of electrical connection pads and/or at least a part of the wafer conductive layer respectively leads out the electrical connection pads.

According to some embodiments, a contact area of a single contact region between the wafer conductive layer and the electrical connection pads is smaller than a contact area of a single contact region between the wafer conductive layer and the conductive filled vias.

According to some embodiments, the at least one metal feature includes a connection structure and/or a heat dissipation structure, the connection structure includes a connection pad, and the heat dissipation structure includes a heat dissipation pad.

According to some embodiments, the heat dissipation structure further includes a back surface heat sink, and the back surface heat sink is applied to a die back surface of the at least one die through a thermally conductive material.

According to some embodiments, a die back surface of the at least one die is applied with a metal layer, and a surface of the metal layer is exposed from a molding layer back surface of the molding layer.

According to some embodiments, the at least one metal feature has a metal feature back surface, the metal feature back surface is exposed from the molding layer back surface, and the surface of the metal layer is connected with the metal feature back surface through a conductive paste.

According to some embodiments, a die back surface of the at least one die and a metal unit back surface of the metal unit are exposed from a molding layer back surface of the molding layer, and such portion exposed from the molding layer back surface is provided with a surface treatment layer.

According to some embodiments, the at least one die comprises two or more dies, the two or more dies are dies having different functions, and the plurality of dies are electrically connected according to product design.

According to some embodiments, the chip structure further comprises a dielectric layer that encapsulates the panel-level conductive layer, and an outermost dielectric layer completely encapsulates the panel-level conductive layer.

At least one embodiment in the present disclosure relates to a chip packaging method, comprising: providing a wafer, and forming a wafer conductive layer and a protective layer on a wafer active surface of the wafer; forming protective layer openings in the protective layer; cutting and separating the wafer to form a die; providing a metal structure, the metal structure including at least one metal unit; adhering the die and the metal structure onto a carrier; and forming a molding layer.

According to some embodiments, the chip packaging method further comprises forming conductive filled vias and forming a panel-level conductive layer, wherein the die is connected with at least one metal feature of the at least one metal unit through the panel-level conductive layer.

According to some embodiments, at least a part of the wafer conductive layer is formed at electrical connection pads and/or heat dissipation positions provided on the die; at least a part of the protective layer openings are formed at the wafer conductive layer; a conductive material is filled in the protective layer openings to form the conductive filled vias and to form the panel-level conductive layer; the panel-level conductive layer is formed on a surface of the protective layer and a molding layer front surface of the molding layer; at least a portion of the panel-level conductive layer is connected with the conductive filled vias and is connected with the at least one metal unit; and the surface of the protective layer, the molding layer front surface, and a metal unit front surface of the at least one metal unit are flush with one another.

According to some embodiments, the at least one metal feature includes a connection structure and/or a heat dissipation structure, the connection structure includes a connection pad, and the heat dissipation structure includes a heat dissipation pad.

According to some embodiments, the heat dissipation structure further includes a back surface heat sink, and the back surface heat sink is applied to a die back surface of the die through a thermally conductive material.

According to some embodiments, the chip packaging method further comprises: applying a metal layer to a die back surface of the die, and connecting a surface of the metal layer with a metal feature back surface of the at least one metal feature through a conductive paste.

According to some embodiments, the chip packaging method further comprises: forming a dielectric layer that encapsulates the panel-level conductive layer, wherein an outermost dielectric layer completely encapsulates the panel-level conductive layer.

According to some embodiments, the metal structure is a metal frame, and the at least one metal unit comprises a plurality of metal units; the metal frame is transferred to the carrier through a temporary support; and after the metal frame is arranged on the temporary support, the method further comprises: cutting and separating a connection bar of the metal frame so that the metal units in the metal frame are independent of one another.

According to some embodiments, the metal structure is a metal frame, and the at least one metal unit comprises a plurality of metal units; the metal frame is transferred to the carrier through a temporary support; and after the metal frame is arranged on the temporary support, the method further comprises: removing a connection bar from the metal frame so that the metal units in the metal frame are independent of one another.

At least one embodiment in the present disclosure relates to a chip structure, comprising: at least one die; a protective layer; a metal unit, the metal unit including at least one metal feature; a molding layer, encapsulating the at least one die and the metal unit; and a dielectric layer, wherein the chip structure is connected with an external circuit through the at least one metal feature.

According to some embodiments, the chip structure further comprises a conductive structure, the conductive structure includes a wafer conductive layer and a panel-level conductive layer, and the at least one metal feature of the metal unit is connected with the at least one die through the conductive structure.

According to some embodiments, the wafer conductive layer includes wafer conductive traces and wafer conductive studs; at least a part of the wafer conductive traces are connected with electrical connection pads and/or heat dissipation positions provided on the at least one die; at least a part of the wafer conductive studs are provided on the wafer conductive traces; the panel-level conductive layer is provided on a surface of the protective layer and a molding layer front surface of the molding layer; at least a portion of the panel-level conductive layer is connected with the wafer conductive studs and is connected with the metal unit; and the surface of the protective layer, the molding layer front surface, and a metal unit front surface of the metal unit are flush with one another.

According to some embodiments, at least a part of the wafer conductive traces respectively lead out the electrical connection pads and/or each of at least a part of the wafer conductive traces interconnects and leads out a plurality of electrical connection pads.

According to some embodiments, the at least one metal feature includes a connection structure and/or a heat dissipation structure, the connection structure includes a connection pad, and the heat dissipation structure includes a heat dissipation pad.

According to some embodiments, the heat dissipation structure further includes a back surface heat sink, and the back surface heat sink is applied to a die back surface of the at least one die through a thermally conductive material.

According to some embodiments, a die back surface of the at least one die is applied with a metal layer, and a surface of the metal layer is exposed from a molding layer back surface of the molding layer.

According to some embodiments, the at least one metal feature has a metal feature back surface, the metal feature back surface is exposed from the molding layer back surface, and the surface of the metal layer is connected with the metal feature back surface through a conductive paste.

According to some embodiments, a die back surface of the at least one die and a metal unit back surface of the metal unit are exposed from a molding layer back surface of the molding layer, and such portion exposed from the molding layer back surface is provided with a surface treatment layer.

According to some embodiments, the at least one die comprises two or more dies, the two or more dies are dies having different functions, and the two or more dies are electrically connected according to product design.

According to some embodiments, the dielectric layer encapsulates the panel-level conductive layer, and an outermost dielectric layer completely encapsulates the panel-level conductive layer.

At least one embodiment in the present disclosure relates to a chip packaging method, comprising: providing a wafer, and forming a protective layer on a wafer active surface of the wafer; cutting and separating the wafer to form a die; providing a metal structure, the metal structure including at least one metal unit; adhering the die and the metal structure onto a carrier; forming a molding layer; and forming a dielectric layer.

According to some embodiments, the chip packaging method further comprises: forming a conductive structure, wherein the die is connected with at least one metal feature of the at least one metal unit through the conductive structure.

According to some embodiments, the forming the conductive structure includes: forming wafer conductive traces on the wafer active surface, wherein at least a part of the wafer conductive traces are formed at electrical connection pads and/or heat dissipation positions provided on the die; forming wafer conductive studs on the wafer conductive traces; forming a panel-level conductive layer on a surface of the protective layer of the die and a molding layer front surface of the molding layer, wherein at least a portion of the panel-level conductive layer is connected with the wafer conductive studs and is connected with the at least one metal unit; and the surface of the protective layer, the molding layer front surface, and a metal unit front surface of the at least one metal unit are flush with one another.

According to some embodiments, the at least one metal feature includes a connection structure and/or a heat dissipation structure, the connection structure includes a connection pad, and the heat dissipation structure includes a heat dissipation pad.

According to some embodiments, the heat dissipation structure further includes a back surface heat sink, and the back surface heat sink is applied to a die back surface of the die through a thermally conductive material.

According to some embodiments, the chip packaging method further comprises: applying a metal layer to a die back surface of the die, and connecting a surface of the metal layer with a metal feature back surface of the at least one metal feature through a conductive paste.

According to some embodiments, the dielectric layer encapsulates the panel-level conductive layer, and an outermost dielectric layer completely encapsulates the panel-level conductive layer.

According to some embodiments, the metal structure is a metal frame, and the at least one metal unit comprises a plurality of metal units; the metal frame is transferred to the carrier through a temporary support; and after the metal frame is arranged on the temporary support, the method further comprises: cutting and separating a connection bar of the metal frame so that the metal units in the metal frame are independent of one another.

According to some embodiments, the metal structure is a metal frame, and the at least one metal unit comprises a plurality of metal units; the metal frame is transferred to the carrier through a temporary support; and after the metal frame is arranged on the temporary support, the method further comprises: removing a connection bar from the metal frame so that the metal units in the metal frame are independent of one another.

According to some embodiments, in the various embodiments described above, the protective layer is made of an organic/inorganic composite material.

According to some embodiments, in the various embodiments described above, the protective layer has a Young's modulus of any numerical range or value below: 1,000 MPa to 20,000 MPa, 1,000 MPa to 10,000 MPa, 4,000 MPa to 8,000 MPa and 5,500 MPa.

According to some embodiments, in the various embodiments described above, the protective layer has a thickness of any numerical range or value below: 15 μm to 50 μm, 20 μm to 50 μm, 35 μm, 45 μm and 50 μm.

According to some embodiments, in the various embodiments described above, the protective layer has a coefficient of thermal expansion of any numerical range or value below: 3 ppm/K to 10 ppm/K, 5 ppm/K, 7 ppm/K and 10 ppm/K.

According to some embodiments, in the various embodiments described above, the encapsulation layer has a coefficient of thermal expansion of any numerical range or value below: 3 ppm/K to 10 ppm/K, 5 ppm/K, 7 ppm/K and 10 ppm/K.

According to some embodiments, in the various embodiments described above, the protective layer and the encapsulation layer have a same or similar coefficient of thermal expansion.

According to some embodiments, in the various embodiments described above, the protective layer includes inorganic filler particles.

According to some embodiments, in the various embodiments described above, the inorganic filler particles have a diameter of less than 3 μm.

According to some embodiments, in the various embodiments described above, the inorganic filler particles have a diameter between 1 μm and 2 μm.

The specific embodiments as described above are intended to further explain the technical solutions and technical effects of the present disclosure in detail; but it should be understood by those skilled in the art that the foregoing embodiments merely are specific embodiments, and not intended to limit the present disclosure; any modification, equivalent substitution, improvement and the like, made within the inventive ideas of the present disclosure should be covered within the protection scope of the present disclosure.

What is claimed is:

1. A chip structure, comprising:
   at least one die having a die active surface and a die back surface opposed to each other, wherein the die active surface comprises electrical connection pads;
   a protective layer having a first protective layer surface and a second protective layer surface opposed to each other, wherein the second protective layer surface is disposed on the die active surface;
   a metal unit, the metal unit including at least one metal feature, wherein the at least one metal feature comprises at least one connection pad and the at least one connection pad has a connection pad front surface and a connection pad back surface opposed to each other;

a molding layer, encapsulating the at least one die and the metal unit, and the molding layer having a molding layer front surface and a molding layer back surface opposed to each other, wherein the chip structure is connected with an external circuit via the at least one metal feature, wherein the connection pad front surface is substantially coplanar with the first protective layer surface, and the connection pad back surface is substantially coplanar with the die back surface, wherein the molding layer front surface is substantially coplanar with the connection pad front surface, and the molding layer back surface is substantially coplanar with the connection pad back surface, a conductive structure connecting the at least one metal feature of the metal unit is connected with the at least one die, structure, wherein the conductive structure comprises conductive filled vias and a panel-level conductive layer;

the conductive filled vias are provided by filling protective layer openings with a conductive material, and the protective layer openings are provided in the protective a layer, at least one of the conductive filled vias is connected with electrical connection pads and/or heat dissipation positions provided on the at least one die;

the panel-level conductive layer is provided on the first protective layer surface and the molding layer front surface; and at least a portion of the panel-level conductive layer is connected with the conductive filled vias and is connected with the metal unit;

a dielectric layer encapsulating the panel-level conductive layer, and an outermost dielectric layer completely encapsulating the panel-level conductive layer.

2. The chip structure according to claim 1, wherein the at least one metal feature comprises a connection structure and/or a heat dissipation structure, the connection structure includes the at least one connection pad, and the heat dissipation structure includes a heat dissipation pad.

3. The chip structure according to claim 2, wherein the heat dissipation structure further comprises a back surface heat sink, and the back surface heat sink is applied to a die back surface of the at least one die via a thermally conductive material.

4. The chip structure according to claim 1, wherein a metal layer is applied on a die back surface of the at least one die, and a surface of the metal layer is exposed from a molding layer back surface of the molding layer.

5. The chip structure according to claim 4, wherein the at least one metal feature has a metal feature back surface, the metal feature back surface is exposed from the molding layer back surface, and the surface of the metal layer is connected with the metal feature back surface via a conductive paste.

6. The chip structure according to claim 1, wherein the die back surface of the at least one die and a metal unit back surface of the metal unit are exposed from a molding layer back surface of the molding layer, and the exposed die back surface and the metal unit back surface are provided with a surface treatment layer.

7. The chip structure according to claim 1, wherein the at least one die comprises two or more dies, the two or more dies have different functions, and the two or more dies are electrically connected together.

8. The chip structure according to claim 1, wherein the protective layer comprises an organic/inorganic composite material.

9. The chip structure according to claim 1, wherein the protective layer has a Young's modulus ranging from 1,000 MPa to 20,000 MPa.

10. The chip structure according to claim 1, wherein the protective layer has a thickness of ranging from 15 μm to 50 μm.

11. The chip structure according to claim 1, wherein the protective layer has a coefficient of thermal expansion ranging from 3 ppm/K to 10 ppm/K.

12. The chip structure according to claim 1, wherein the molding layer has a coefficient of thermal expansion ranging from 3 ppm/K to 10 ppm/K.

13. The chip structure according to claim 1, wherein the protective layer and the molding layer have a substantially same coefficient of thermal expansion.

14. The chip structure according to claim 1, wherein the protective layer comprises inorganic filler particles; and the inorganic filler particles have a diameter of less than 3 μm.

15. The chip structure according to claim 1, wherein the conductive filled vias have a lower surface and an upper surface, and the conductive filled vias have an area ratio of the lower surface to the upper surface ranging from 60% to 90%.

16. The chip structure according to claim 15, wherein a gap is between the lower surface of the conductive filled vias and an insulating layer provided on the die active surface; and/or the lower surface of the conductive filled vias are located at a position close to a central portion of the electrical connection pads.

17. The chip structure according to claim 1, wherein a conductive cover layer is provided on the electrical connection pads.

* * * * *